US012787757B2

(12) United States Patent
Lin

(10) Patent No.: US 12,787,757 B2
(45) Date of Patent: Nov. 3, 2026

(54) SEMICONDUCTOR DEVICE HAVING AT LEAST ONE AIR GAP AND METHOD FOR MANUFACTURING THE SAME

(71) Applicant: NANYA TECHNOLOGY CORPORATION, New Taipei City (TW)

(72) Inventor: Yuan-Yuan Lin, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 398 days.

(21) Appl. No.: 18/396,816

(22) Filed: Dec. 27, 2023

(65) Prior Publication Data

US 2025/0218864 A1 Jul. 3, 2025

(51) Int. Cl.

| | |
|---|---|
| ***H10W 20/46*** | (2026.01) |
| ***H10B 12/00*** | (2023.01) |
| ***H10W 20/00*** | (2026.01) |
| ***H10W 20/43*** | (2026.01) |

(52) U.S. Cl.

CPC ........ *H10W 20/46* (2026.01); *H10B 12/0335* (2023.02); *H10B 12/482* (2023.02); *H10W 20/072* (2026.01); *H10W 20/43* (2026.01)

(58) Field of Classification Search

None

See application file for complete search history.

(56) References Cited

U.S. PATENT DOCUMENTS

2020/0373305 A1* 11/2020 Hsu .................... H10B 12/0335
2022/0059458 A1* 2/2022 Wu ..................... H10W 20/074
2022/0293607 A1 9/2022 Chen

FOREIGN PATENT DOCUMENTS

TW 202044357 A 12/2020
TW 202141736 A 11/2021

OTHER PUBLICATIONS

Office Action and and the search report mailed on May 22, 2025 related to Taiwanese Application No. 113106299.
Summary translation of Office Action and and the search report mailed on May 22, 2025 related to Taiwanese Application No. 113106299.
Office Action and and the search report mailed on Feb. 13, 2025 related to Taiwanese Application No. 113106299.
Summary translation of Office Action and and the search report mailed on Feb. 13, 2025 related to Taiwanese Application No. 113106299.

* cited by examiner

*Primary Examiner* — Hung K Vu
(74) *Attorney, Agent, or Firm* — Xuan Zhang

(57) ABSTRACT

The present application discloses a semiconductor device and a method for fabricating the same. The semiconductor device includes an upper metal line and a lower metal line. The upper metal line is disposed over the lower metal line. At least one air gap is disposed between the upper metal line and the lower metal line.

12 Claims, 34 Drawing Sheets

SEMICONDUCTOR DEVICE HAVING AT LEAST ONE AIR GAP AND METHOD FOR MANUFACTURING THE SAME

TECHNICAL FIELD

The present disclosure relates to a semiconductor device and a method for fabricating a semiconductor device, and more particularly, to a semiconductor device having at least one air gap.

DISCUSSION OF THE BACKGROUND

In a semiconductor device, an upper metal line can be placed over a lower metal line, which can cause unwanted parasitic capacitance. Such capacitance can negatively impact a response speed of the device, especially as smaller and smaller electronic devices are made and gaps between the metal lines become ever smaller.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device. The semiconductor device includes a substrate with a drain region and a source region disposed in the substrate; a gate structure disposed over the substrate and between the drain region and the source region; a first dielectric disposed over the substrate and covering the substrate and the gate structure; a plug disposed in the first dielectric, wherein the plug includes a first portion extending through the first dielectric and contacting the source region of the substrate, and a second portion protruding from the first dielectric; a storage node landing pad disposed on an exposed part of the second portion of the plug; a second dielectric disposed over the first dielectric and covering the storage node landing pad; at least one air gap disposed in the second dielectric; a bit line extending through the second dielectric and the first dielectric and connecting to the substrate; a third dielectric disposed over the bit line; and a storage node disposed over the third dielectric, wherein the storage node extends through the third dielectric and the second dielectric and contacts the storage node landing pad.

Another aspect of the present disclosure provides a semiconductor device. The semiconductor device includes a substrate with a source region, a drain region, and a word line disposed in the substrate; a dielectric layer disposed over the substrate; at least one air gap disposed in the dielectric layer; a plug disposed in the dielectric layer; a barrier layer disposed on sidewalls of the plug; and a landing pad disposed over the dielectric layer. The barrier layer comprises a top portion over the dielectric layer.

Another aspect of the present disclosure provides a method for fabricating a semiconductor device. The method includes providing a substrate with a gate structure disposed thereon; forming a first interlayer dielectric covering the substrate and the gate structure; forming a plug in the first interlayer dielectric; exposing a portion of the plug; forming a storage node landing pad on the exposed portion of the plug; forming a second interlayer dielectric on the first interlayer dielectric, wherein the second interlayer dielectric comprises at least one air gap; forming a bit line extending through the second interlayer dielectric and the first interlayer dielectric and connecting to the substrate; forming a third interlayer dielectric on the bit line; and forming a storage node on the third interlayer dielectric.

By utilizing at least one air gap in the semiconductor device, a parasitic capacitance between the upper metal line and the lower metal line can be reduced, thus increasing the efficiency of the semiconductor device.

The foregoing has outlined rather broadly the features and technical advantages of the present disclosure so that the detailed description of the disclosure that follows may be better understood. Additional features and advantages of the disclosure will be described hereinafter and form the subject of the claims of the disclosure. It should be appreciated by those skilled in the art that the conception and specific embodiment disclosed may be readily utilized as a basis for modifying or designing other structures or processes for conducting the same purposes of the present disclosure. It should also be realized by those skilled in the art that such equivalent constructions do not depart from the spirit and scope of the disclosure as set forth in the appended claims.

BRIEF DESCRIPTION OF THE DRA WINGS

Aspects of the present disclosure are best understood from the following detailed description when read with the accompanying figures. It should be noted that, in accordance with the standard practice in the industry, various features are not drawn to scale. The dimensions of the various features may be arbitrarily increased or reduced for clarity of discussion.

DETAILED DESCRIPTION

Figure 1:
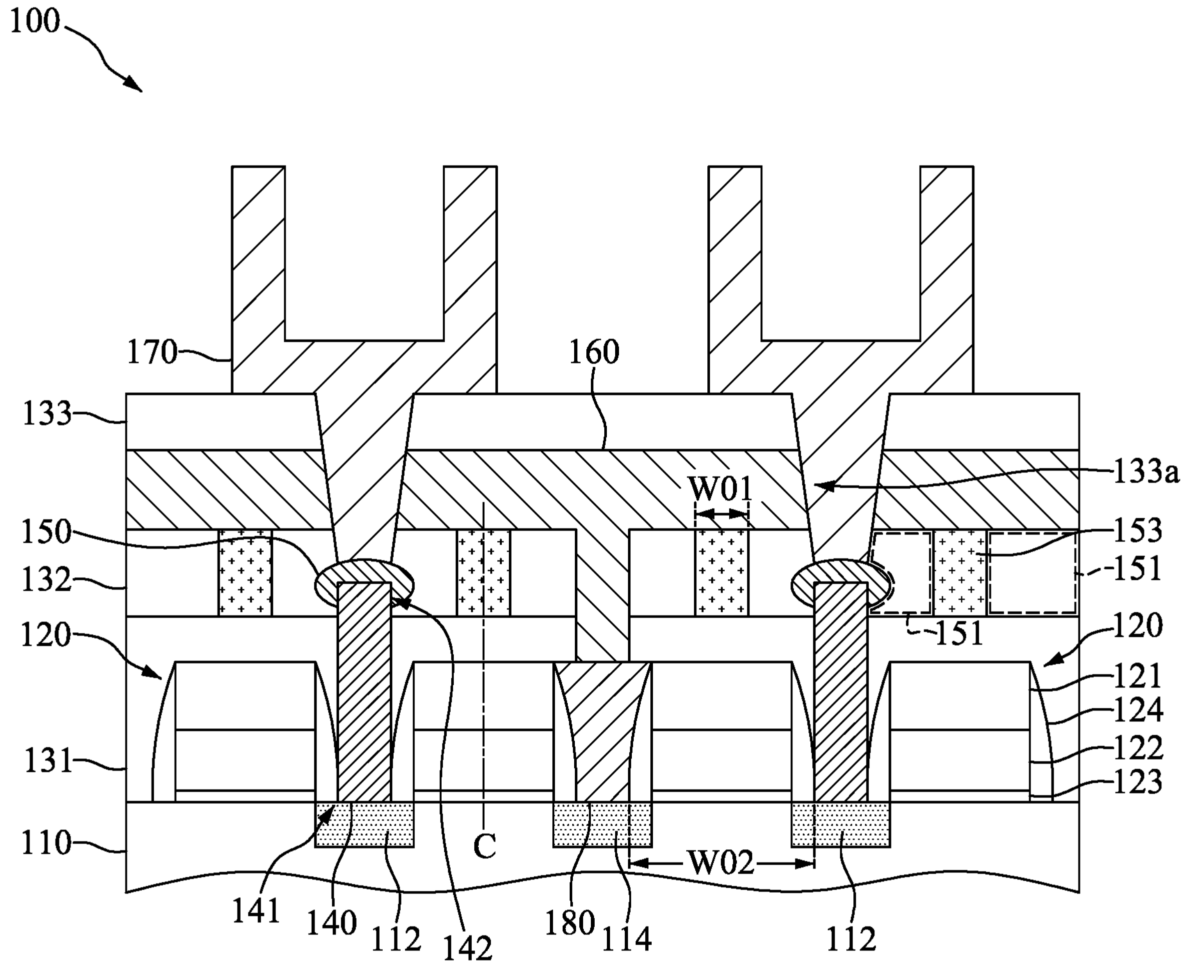
FIG. 1 is a sectional view of a semiconductor device in accordance with one embodiment of the present disclosure.

Embodiments, or examples, of the disclosure illustrated in the drawings, are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, such elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is to describe particular example embodiments only and is not intended to limit the present inventive concept. As used herein, the singular forms "a," "an" and "the" are intended to include the plural forms as well, unless the context indicates otherwise. It shall be further understood that the terms "comprises" and "comprising," when used in this specification, point out the presence of stated features, integers, steps, operations, elements or components, but do not preclude the presence or addition of one or more other features, integers, steps, operations, elements, components or groups thereof.

FIG. 1 is a sectional view of a semiconductor device 100 in accordance with one embodiment of the present disclosure. The semiconductor device 100 includes a substrate 110, a first interlayer dielectric 131, a second interlayer dielectric 132, a plug 140, a storage node landing pad 150, a bit line 160, a third interlayer dielectric 133, and a storage node 170.

Referring to FIG. 1, the substrate 110 includes a drain region 112 and a source region 114 disposed in the substrate 110. In some embodiments, the substrate 110 is a semiconductor substrate, such as a silicon substrate. A gate structure 120 is disposed over the substrate 110 and between the drain region 112 and the source region 114. In some embodiments, the gate structure 120 includes a silicide 121, a polycrystalline silicon 122, a gate oxide 123, and a spacer 124.

The first interlayer dielectric 131 is disposed over the substrate 110 and under the second interlayer dielectric 132. The second interlayer dielectric 132 is disposed over the first interlayer dielectric 131 and under the third interlayer dielectric 133. In some embodiments, the first interlayer dielectric 131, the second interlayer dielectric 132, and the third interlayer dielectric 133 are formed of a material such as silicon oxide, silicon nitride, silicon oxynitride, phosphosilicate glass (PSG), borophosphosilicate glass (BPSG), low-k dielectric material, and/or another applicable dielectric material. In some embodiments, the first interlayer dielectric 131, the second interlayer dielectric 132, and the third interlayer dielectric 133 are formed by a chemical vapor deposition (CVD) process, an atomic layer deposition (ALD) process, a thermal oxidation process, or the like.

In some embodiments, at least one air gap 153 is formed in the second interlayer dielectric 132. In some embodiments, the air gaps are formed by an etching process, such as a dry etching process, performed on the second interlayer dielectric 132. After the forming of the air gaps, each of the remaining portions of the second interlayer dielectric 132 is referred to as a supporting section.

The plug 140 includes a first portion 141 and a second portion 142. The first portion 141 of the plug 140 is disposed in the first interlayer dielectric 131 and contacts the source region 112 of the substrate 110. The second portion 142 of the plug 140 protrudes from the first interlayer dielectric 131 and is disposed in the second interlayer dielectric 132.

The storage node landing pad 150 covers the second portion 142 of the plug 140 in the second interlayer dielectric 132. In some embodiments, the plug 140 is made of copper, and the storage node landing pad 150 is made of $Cu_3Ge$. However, other materials may be used for the plug 140 and the storage node landing pad 150. In some other embodiments, the plug 140 is made of tungsten or aluminum, and the storage node landing pad 150 is made of gold, silver or aluminum.

The bit line 160 is disposed between the second interlayer dielectric 132 and the third interlayer dielectric 133 and is electrically connected to the drain region 114 of the substrate 110. In some embodiments, the substrate 110 includes a bit line landing pad 180, which allows the bit line 160 to connect to the drain region 114 of the substrate 110 by contacting the bit line landing pad 180.

The storage node 170 is disposed on the third interlayer dielectric 133, and extends through the third interlayer dielectric 133 and the second interlayer dielectric 132 to connect to the storage node landing pad 150, the plug 140 and the source region 112 of the substrate 110.

Figure 2:
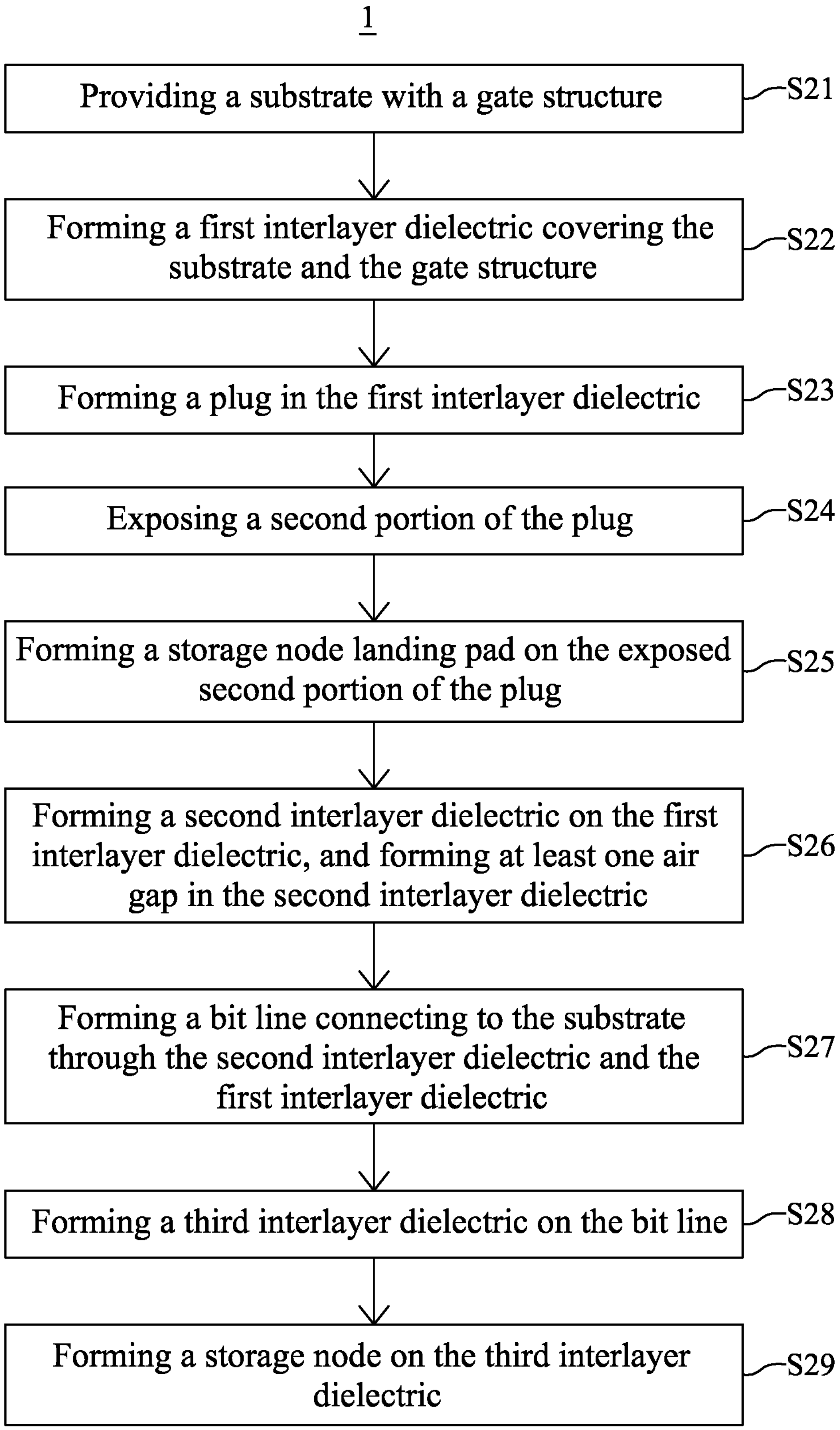
FIG. 2 is a flow diagram illustrating a method for fabricating a semiconductor device in accordance with one embodiment of the present disclosure.

FIG. 2 is a flow diagram illustrating a method 1 for fabricating the semiconductor device 100 in accordance with one embodiment of the present disclosure. FIGS. 3 to 10 are sectional views of intermediate stages in a formation of the semiconductor device 100 in accordance with the method 1. The stages shown in FIGS. 3 to 10 are illustrated schematically in the flow diagram in FIG. 2. In the following discussion, the fabrication stages shown in FIGS. 3 to 10 depict the process steps shown in FIG. 2. The method 1 includes several operations, and description and illustration are not deemed as a limitation to a sequence of the operations. The method 1 includes several steps (S21, S22, S23, S24, S25, S26, S27, S28 and S29).

Figure 3:
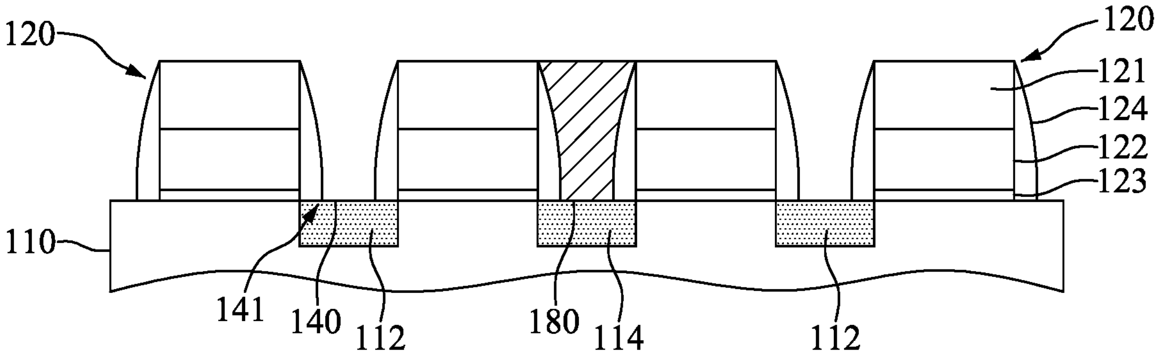
FIGS. 3 to 10 are sectional views of intermediate stages in formation of a semiconductor device in accordance with one embodiment of the present disclosure.

Referring to FIGS. 2 and 3, in step S21, a substrate 110 is provided, with a gate structure 120 disposed thereon. The substrate 110 includes a drain region 114 and a source region 112. The gate structure 120 is disposed between the drain region 114 and the source region 112. In some embodiments, the substrate 110 includes a bit line landing pad 180 to simplify later stages of processes.

Figure 4:
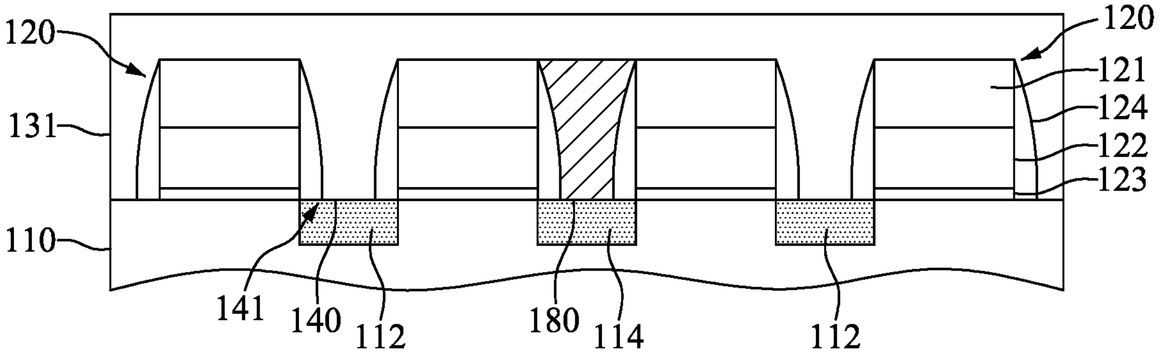

Referring to FIGS. 2 and 4, in step S22, a first interlayer dielectric 131 is formed over the substrate 110 and the gate structure 120. In some embodiments, the first interlayer dielectric 131 is formed by depositing borophosphorous silica glass (BPSG) on the substrate 110. In some embodiments, the first interlayer dielectric 131 is formed by a chemical vapor deposition (CVD) process.

Figure 5:
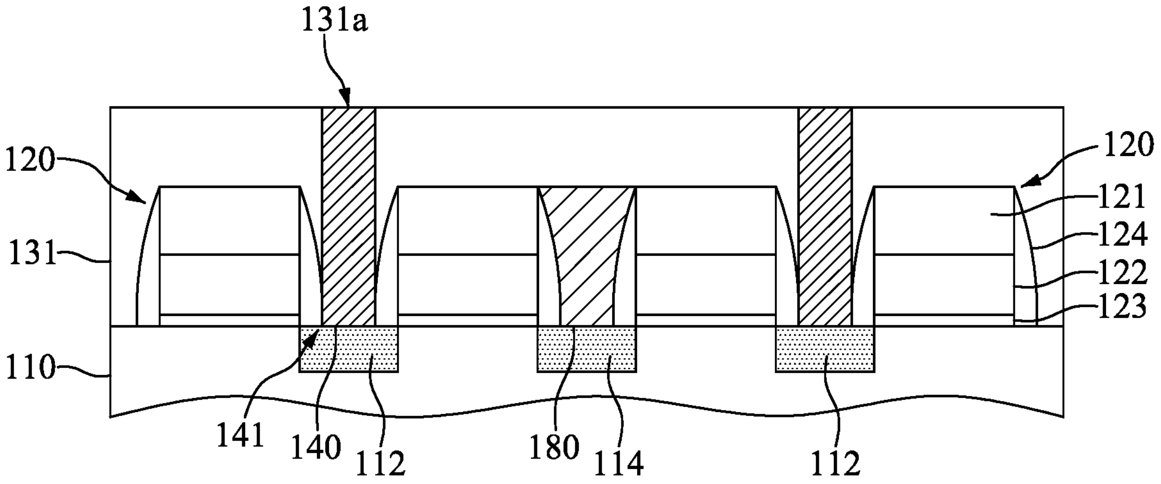

Referring to FIGS. 2 and 5, in step S23, a plug 140 is formed in the first interlayer dielectric 131. The plug 140 includes a first portion 141 in contact with the substrate 110 at the source region 112. In some embodiments, the plug 140 is formed by processes comprising: forming a plug contact hole 131*a* by etching the first interlayer dielectric 131 using a buffered oxide etchant (BOE) as an etchant; depositing a conductive material (not shown) on the first interlayer dielectric 131 and filling the plug contact hole 131*a* such that the conductive material is in contact with the source region 112 of the substrate 110; removing a portion of the conductive material from the first interlayer dielectric 131 by etching the first interlayer dielectric 131, such that only conductive material in the plug contact hole 131*a* is left in place. After removing the portion of conductive material, the plug 140 is formed of the remainder of the conductive material. In some embodiments, the plug 140 is made of copper. In some embodiments, the plug 140 is made of tungsten. In some embodiments, the plug 140 is formed by a CVD process. In some embodiments, a planarization process is performed after the forming of the plug 140.

Figure 6:
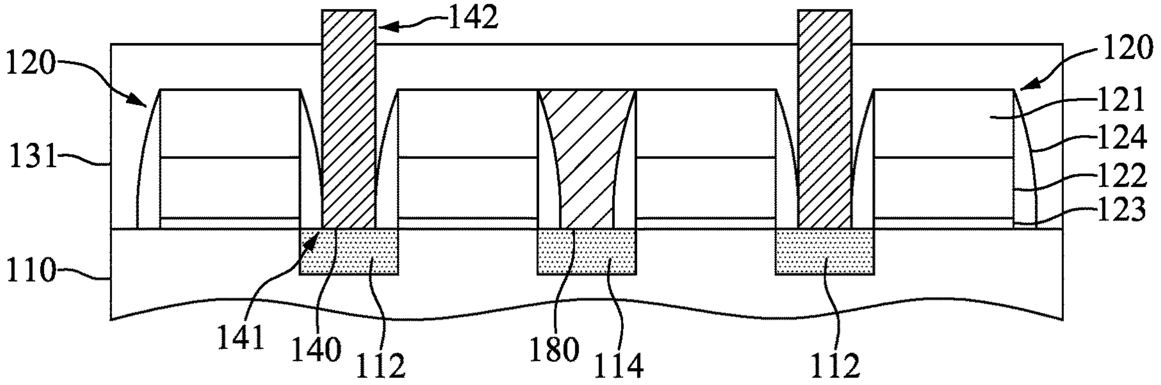

Referring to FIGS. 2 and 6, in step S24, a second portion 142 of the plug 140 is formed by exposing a portion of the plug 140 from the first interlayer dielectric 131. In some embodiments, a conventional technique of oxide buffing, such as chemical mechanical polishing (CMP), is used to remove a portion of the first interlayer dielectric 131 to expose the portion of the plug 140. The exposed portion of the plug 140 is referred to as the second portion 142 of the plug 140. In some embodiments, an oxide etchant is used in an etching process to remove a portion of the first interlayer dielectric 131 and cause the second portion 142 of the plug 140 to be exposed.

Figure 7:
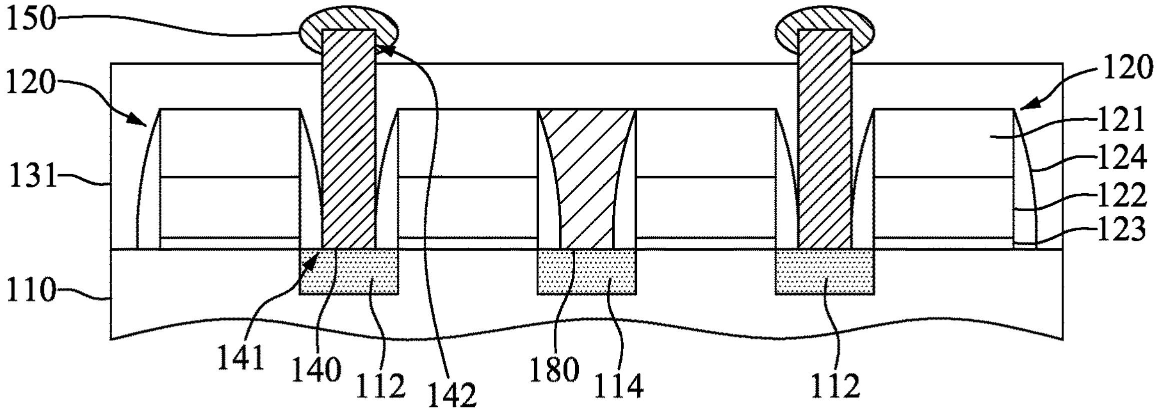

Referring to FIGS. 2 and 7, in step S25, a storage node landing pad 150 is formed on the second portion 142 of the plug 140. In some embodiments, the plug 140 is made of copper, and the storage node landing pad 150 is formed by applying a gas, such as germane ($GeH_4$), to the resultant structure after step S24, as shown in FIG. 6. Germane reacts with the second portion 142 of the plug 140 and forms a $Cu_3Ge$ layer covering the second portion 142 of the plug 140, wherein the $Cu_3Ge$ layer forms the storage node landing pad 150. Since germane does not react with the first interlayer dielectric 131 (which is comprised of, e.g., BPSG), the $Cu_3Ge$ layer can be formed selectively on the second portion 142 of the plug 140. Accordingly, such formation of the $Cu_3Ge$ layer can simplify the manufacturing process since no patterning is required. In addition, the chemical reaction's high selectivity allows the storage node landing pad 150 to self-align, preventing unwanted coupling caused by patterning defects like a stringer or a bridge phenomenon between adjacent pairs of the storage node landing pad 150. In some embodiments, the storage node landing pad 150 is formed using different processes. In some embodiments, an electroplating process is used to form the storage node landing pad 150 on the second portion 142 of the plug 140, since the plug 140 is a highly selective layer compared to the first interlayer dielectric 131.

Figure 8:
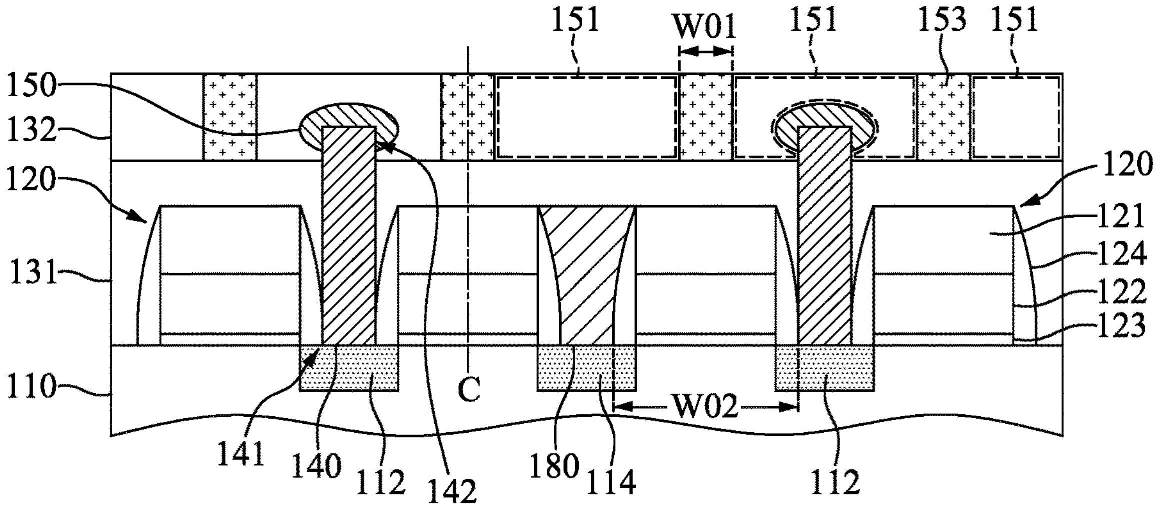

Referring to FIGS. 2 and 8, in step S26, the second interlayer dielectric 132 is formed on the first interlayer dielectric 131 and covers the storage node landing pad 150. In some embodiments, the second interlayer dielectric 132 is formed by a CVD process depositing BPSG on the first interlayer dielectric 131.

Still referring to FIGS. 2 and 8, in step S26, at least one air gap 153 is formed in the second interlayer dielectric 132. In some embodiments, the air gap 153 is formed by an etching process, such as a dry etching process, performed on the second interlayer dielectric 132. In some embodiments, the air gaps 153 extend through the second interlayer dielectric 132 and separates the second interlayer dielectric 132 into several portions, thus forming a plurality of supporting sections 151. In some embodiments, a width W01 of each of the air gaps 153 is less than a width W02 of the gate structure 120.

Figure 9:
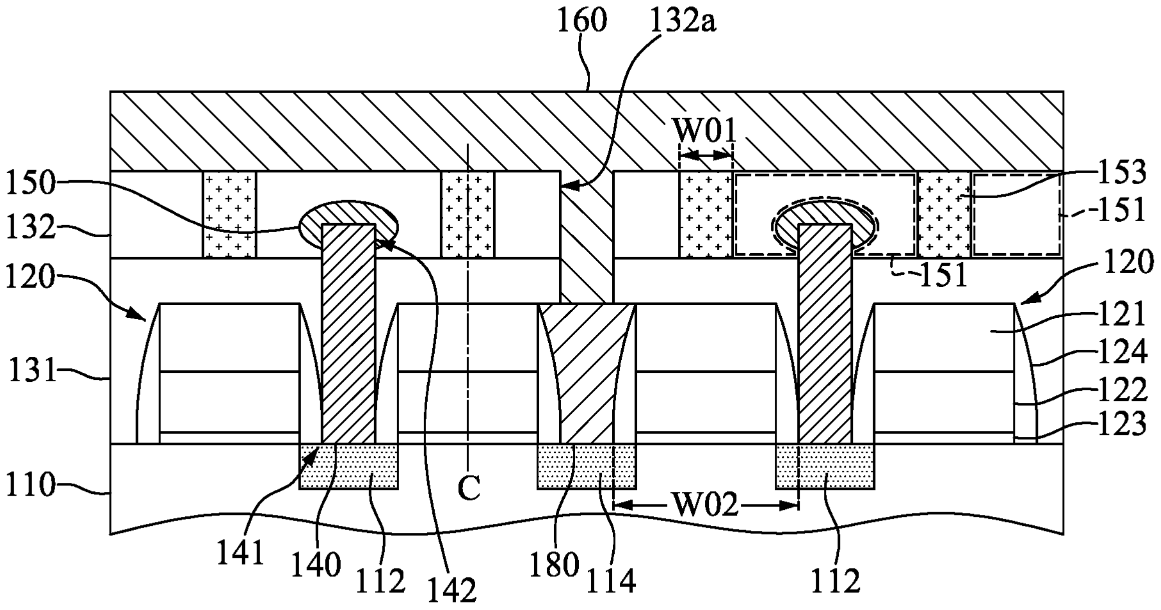

Referring to FIGS. 2 and 9, in step S27, a bit line 160 is formed over the second interlayer dielectric 132 and extends through the second interlayer dielectric 132 and the first interlayer dielectric 131 to connect to the drain region 114 of the substrate 110 via the bit line landing pad 180. In some embodiments, the bit line 160 is formed by processes comprising: forming a bit line contact hole 132*a* to expose the bit line landing pad 180 through the first interlayer dielectric 131 and the second interlayer dielectric 132; forming a conductive layer (not shown) on the second interlayer dielectric 132, thus filling the bit line contact hole 132*a*; and patterning the conductive layer to form the bit line 160. In some embodiments, a BOE may be used to etch the second interlayer dielectric 132 to form the bit line contact hole 132*a*.

Figure 10:
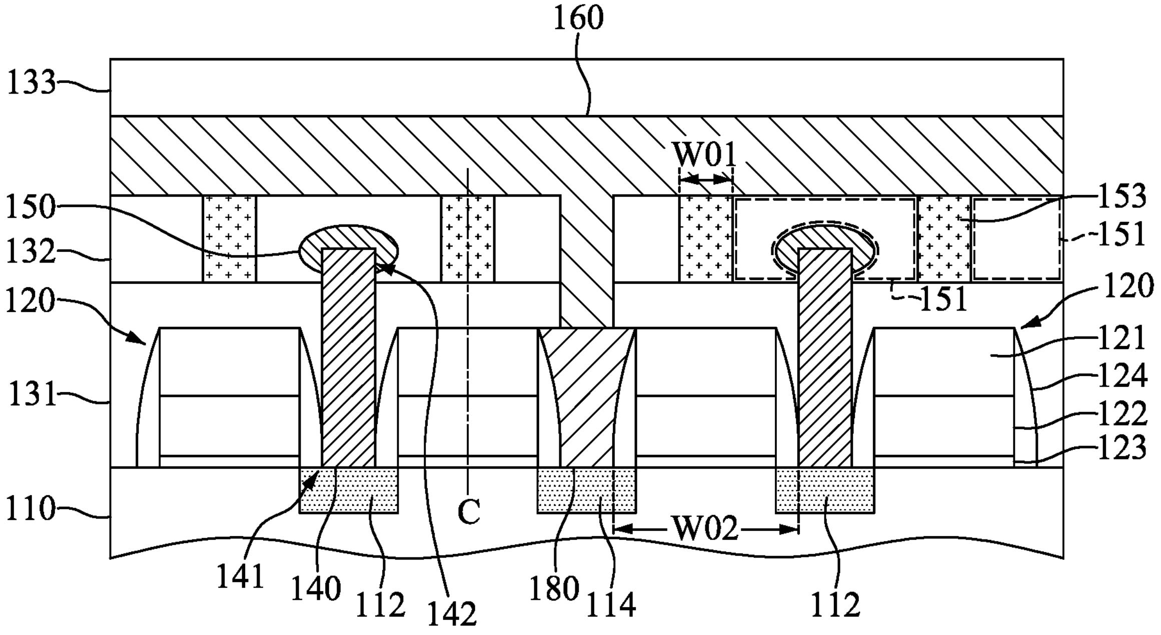

Referring to FIGS. 2 and 10, in step S28, a third interlayer dielectric 133 is formed on the bit line 160. In some embodiments, the third interlayer dielectric 133 is formed by a CVD process depositing BPSG on the bit line 160.

Referring to FIGS. 1 and 2, in step S29, a storage node 170 is formed on the third interlayer dielectric 133. The storage node 170 extends through the third interlayer dielectric 133 and the second interlayer dielectric 132, and contacts the storage node landing pad 150. In some embodiments, the storage node 170 is formed by processes comprising: forming a storage node contact hole 133*a* through the first interlayer dielectric 131 and the second interlayer dielectric 132; disposing a conductive layer (not shown) on the third interlayer dielectric 133, thus filling the storage node contact hole 133*a*; and patterning the conductive layer using a photolithography process to form the storage node 170.

Figure 11:
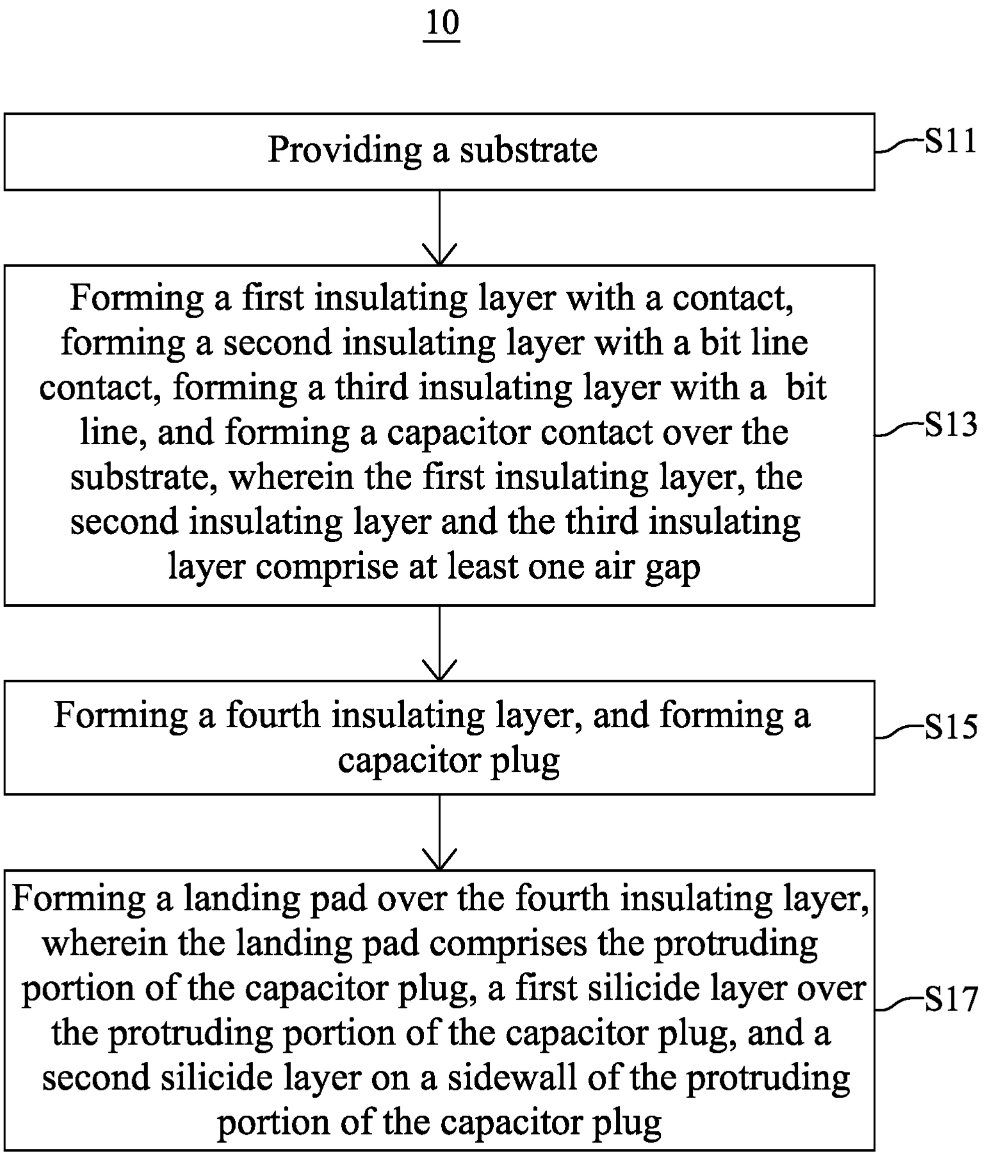
FIG. 11 is a flow diagram illustrating a method for forming a semiconductor device in accordance with another embodiment of the present disclosure.

FIG. 11 is a flow diagram illustrating a method 10 for fabricating a semiconductor device 200 in accordance with another embodiment of the present disclosure. FIGS. 12 to 35 are intermediate stages of forming the semiconductor device 200 in accordance with the method 10, wherein FIGS. 12, 13, 15, 16, 17, 19, 20, 22, 24, 26, 28, 30, 32, 33, 34 and 35 are sectional views, and FIGS. 14, 18, 21, 23, 25, 27, 29 and 31 are top views of FIGS. 13, 17, 20, 22, 24, 26, 28 and 30, respectively.

Referring to FIG. 11 and FIGS. 12 to 19, in step S11, a substrate 101 is provided. An isolation structure 103, a word line 201, a first doped region 301, and a second doped region 303 are formed in the substrate 101.

Figure 12:
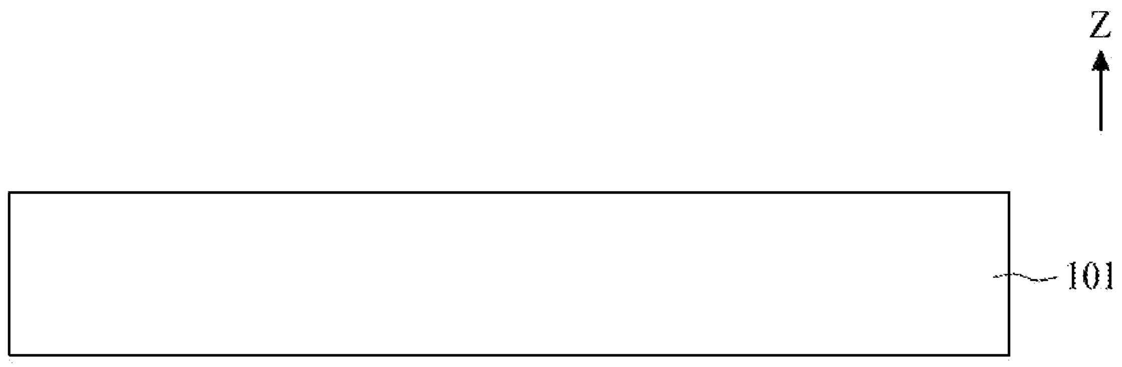
FIGS. 12 and 13 are sectional views of intermediate stages in the formation of a semiconductor device in accordance with some embodiments of the present disclosure.

Referring to FIG. 12, the substrate 101 has a first region (not shown) and a second region (not shown) disposed in the substrate 101. The substrate 101 is formed of, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, or indium gallium phosphide.

Figure 13:
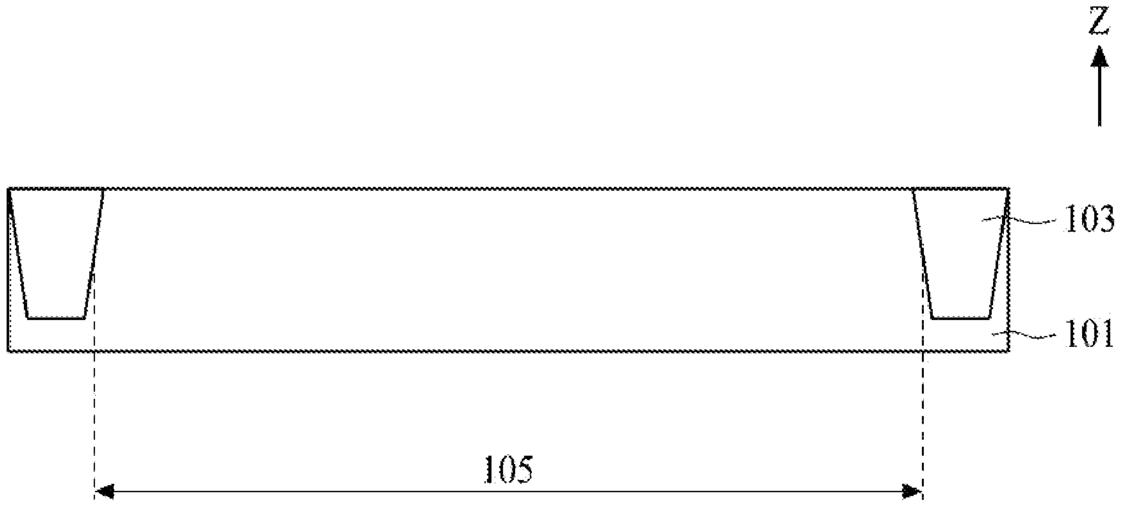
Figure 14:
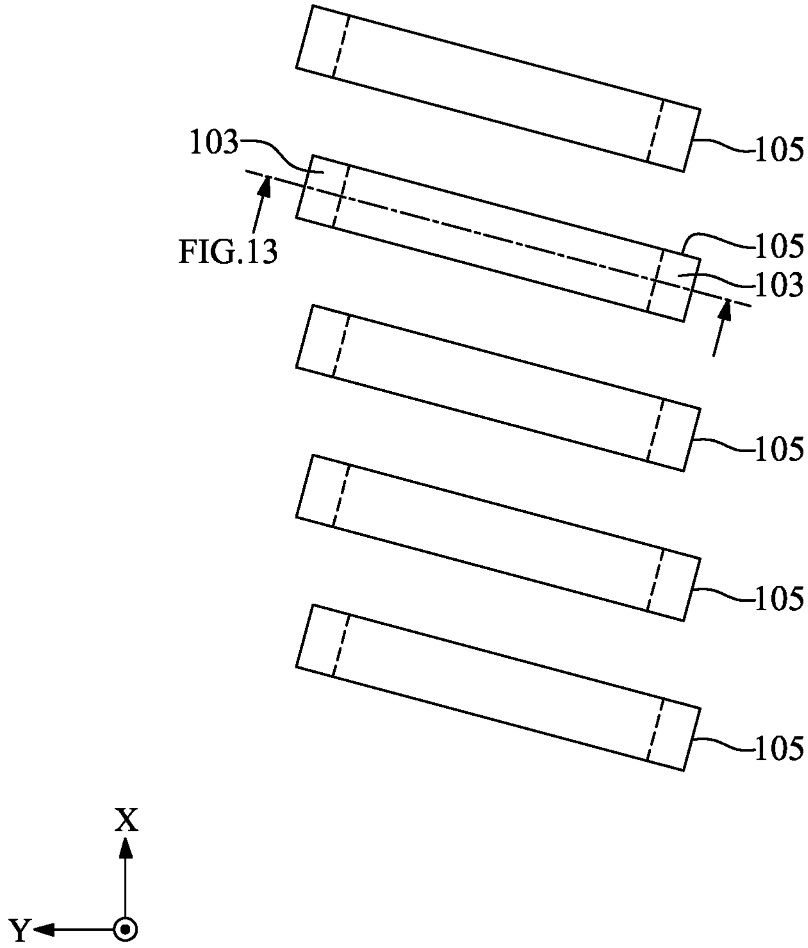
FIG. 14 is a top view of an intermediate stage in accordance with FIG. 13.

Referring to FIGS. 13 and 14, the isolation structure 103 is formed in the substrate 101. Pairs of the isolation structures 103 define an active region 105 and are disposed on opposite sides of the active region 105. The isolation structure 103 is formed of, for example, an insulating material such as silicon oxide, silicon nitride, silicon oxynitride, silicon nitride oxide, fluoride-doped silicate, or the like. The active region 105 may extend in a direction diagonal in relation to a direction X in a top view. It should be noted that, in the present disclosure, silicon oxynitride refers to a substance that contains silicon, nitrogen and oxygen and in which a proportion of oxygen is greater than that of nitrogen. Silicon nitride oxide refers to a substance that contains silicon, oxygen and nitrogen, in which a proportion of nitrogen is greater than that of oxygen.

Figure 15:
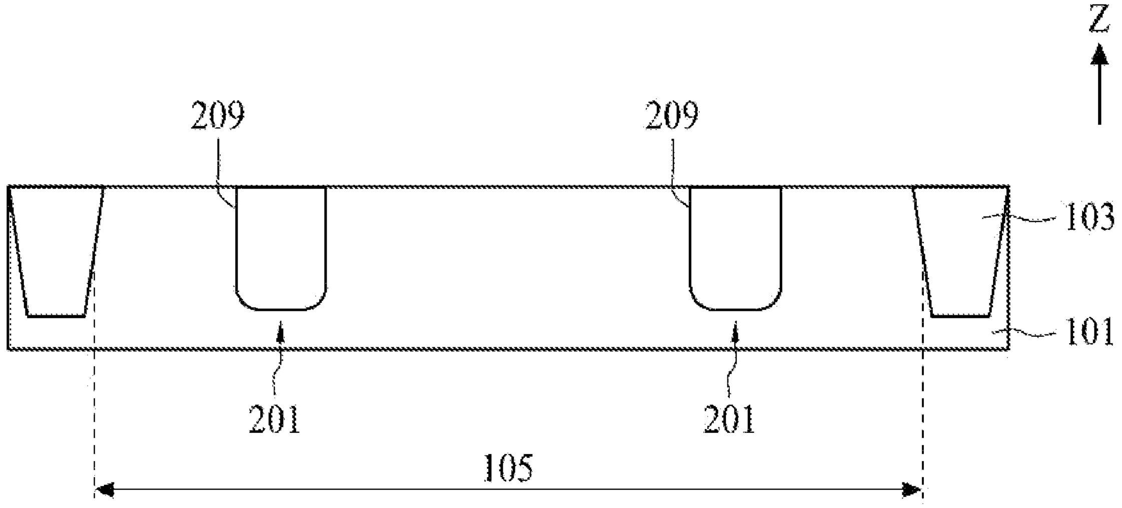
FIGS. 15 to 17 are sectional views of intermediate stages in the formation of a semiconductor device in accordance with some embodiments of the present disclosure.
Figure 16:
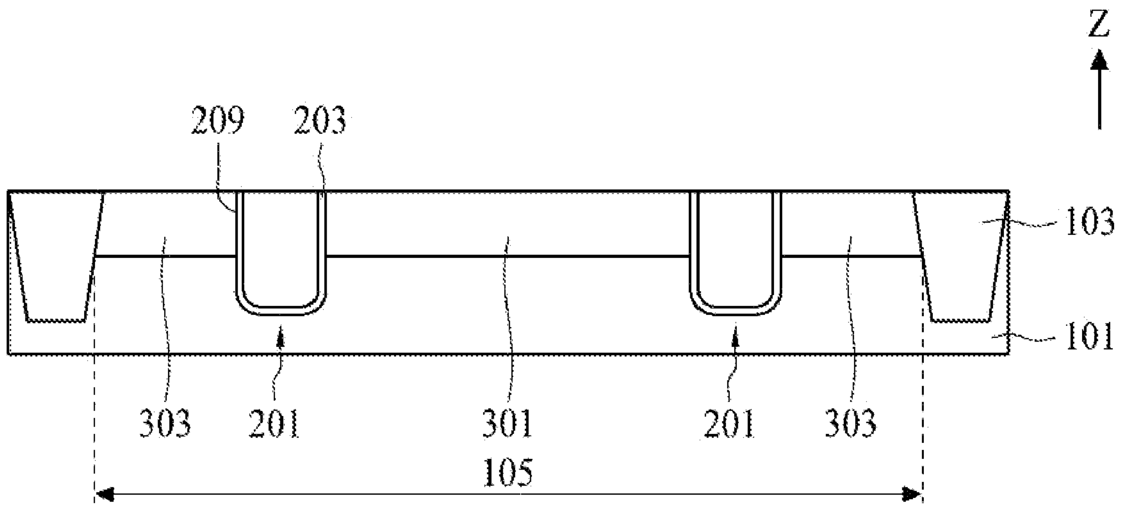

Referring to FIGS. 15 to 18, a word line 201 is formed in the substrate 101. In some embodiments, the word line 201 extends along the direction X. The word line 201 includes a bottom layer 203, a middle layer 205, a top layer 207, and a trench opening 209. Referring to FIG. 15, in some embodiments, a photolithography process is used to pattern the substrate 101 to define a position of the trench opening 209. An etching process, such as an anisotropic dry etching process, is performed to form the trench opening 209 in the substrate 101. Referring to FIG. 16, after the etching process, the bottom layer 203 is formed and attached to sidewalls and a bottom of the trench opening 209. The bottom layer 203 is formed of, for example, silicon oxide, silicon oxynitride, silicon nitride oxide, silicon nitride, or the like.

Figure 17:
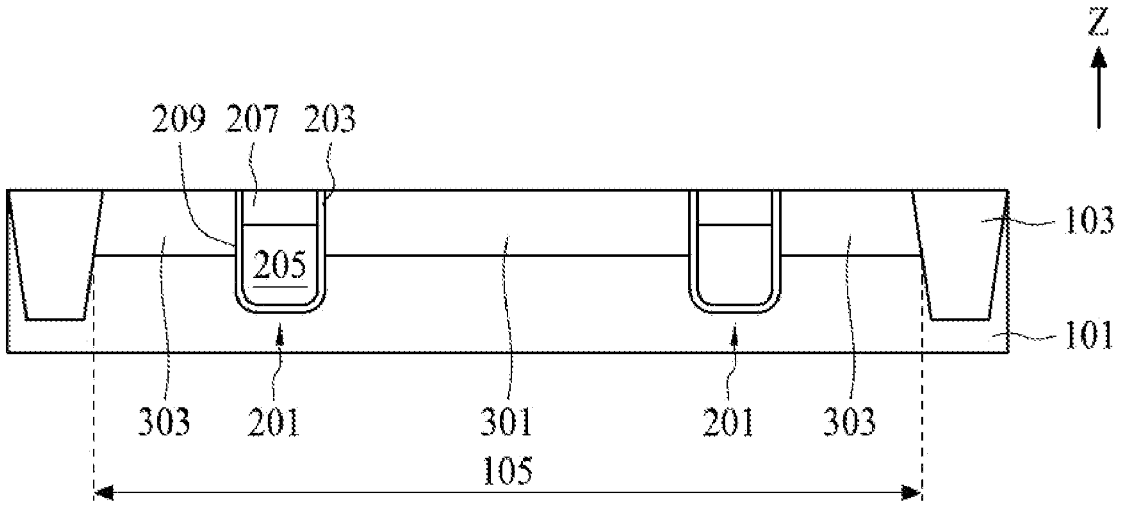
Figure 18:
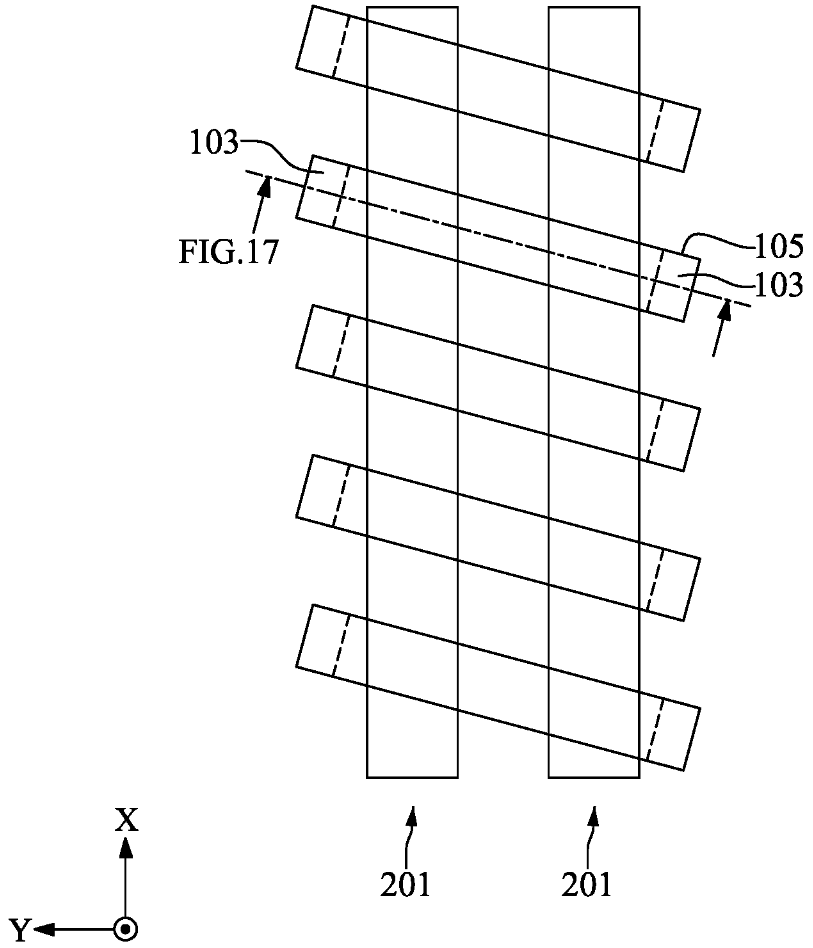
FIG. 18 is a top view of an intermediate stage in accordance with FIG. 17.

Referring to FIGS. 17 and 18, the middle layer 205 is disposed on the bottom layer 203. A top surface of the middle layer 205 is lower than a top surface of the substrate 101. The middle layer 205 is formed of, for example, doped polysilicon, metal material, or metal silicide. The metal silicide may be, for example, nickel silicide, platinum silicide, titanium silicide, molybdenum silicide, cobalt silicide, tantalum silicide, tungsten silicide, or the like. The top layer 207 is disposed on the middle layer 205. A top surface of top layer 207 is at a same vertical level as the top surface of the substrate 101. The top layer 207 is formed of, for example, silicon oxide, silicon oxynitride, silicon nitride oxide, silicon nitride, or the like.

Figure 19:
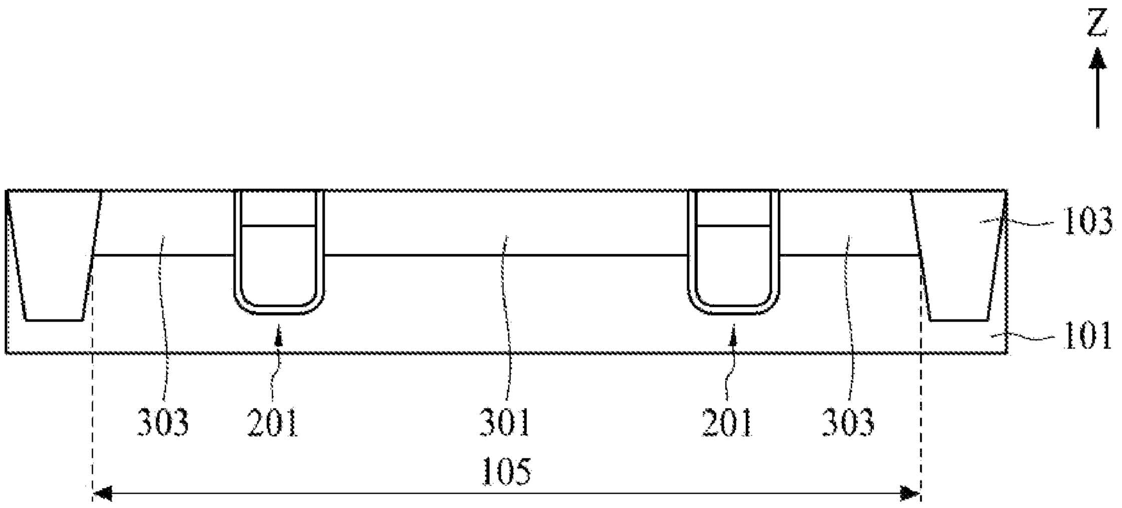
FIGS. 19 to 20 are sectional views of intermediate stages in the formation of a semiconductor device in accordance with some embodiments of the present disclosure.

Referring to FIG. 19, a first doped region 301 and a second doped region 303 are formed in the active region 105 of the substrate 101. The first doped region 301 is disposed between two neighboring word lines 201. The second doped region 303 is disposed between the isolation structure 103 and the word line 201. The first doped region 301 and the second doped region 303 are doped with a dopant such as phosphorus, arsenic, or antimony. The first doped region 301 and the second doped region 303 have a dopant concentration ranging from about 1E17 atoms/$cm^3$ to about 1E19 atoms/$cm^3$.

Referring to FIG. 11 and FIGS. 20 to 31, in step S13, a first insulating layer 801, a second insulating layer 803, a third insulating layer 805, a contact 401, at least one air gap 153, a capacitor contact 403, a bit line contact 405 and a bit line 409 are formed over the substrate 101.

Figure 20:
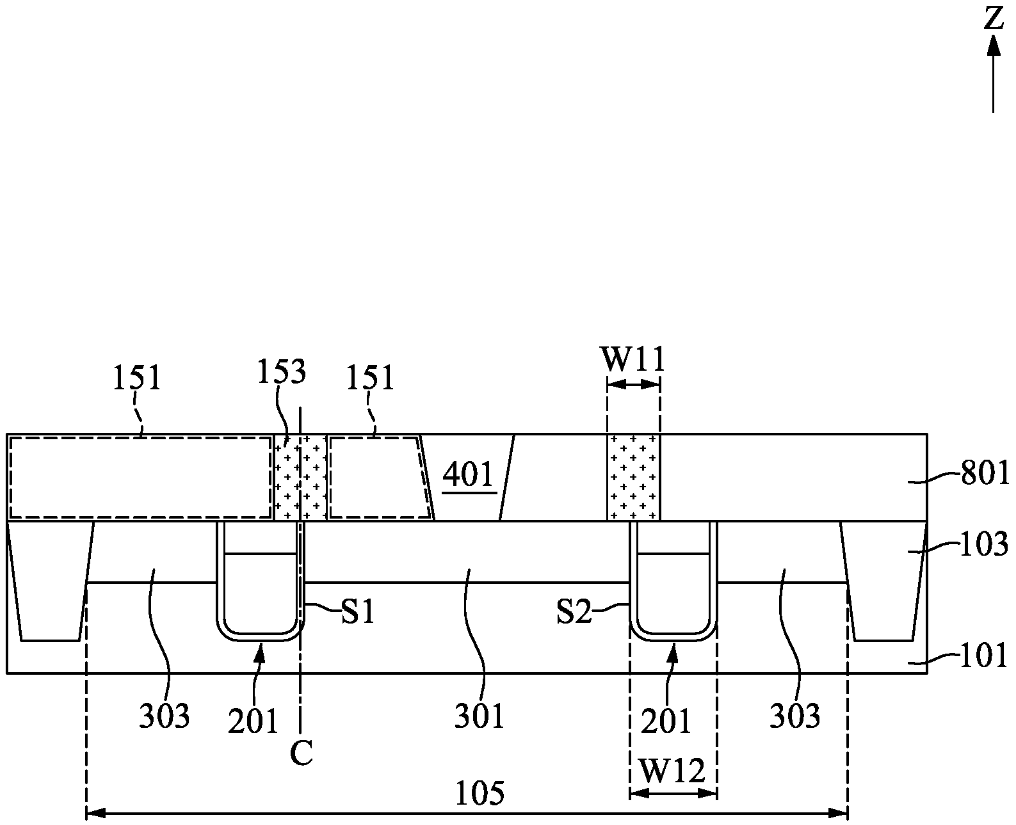
Figure 21:
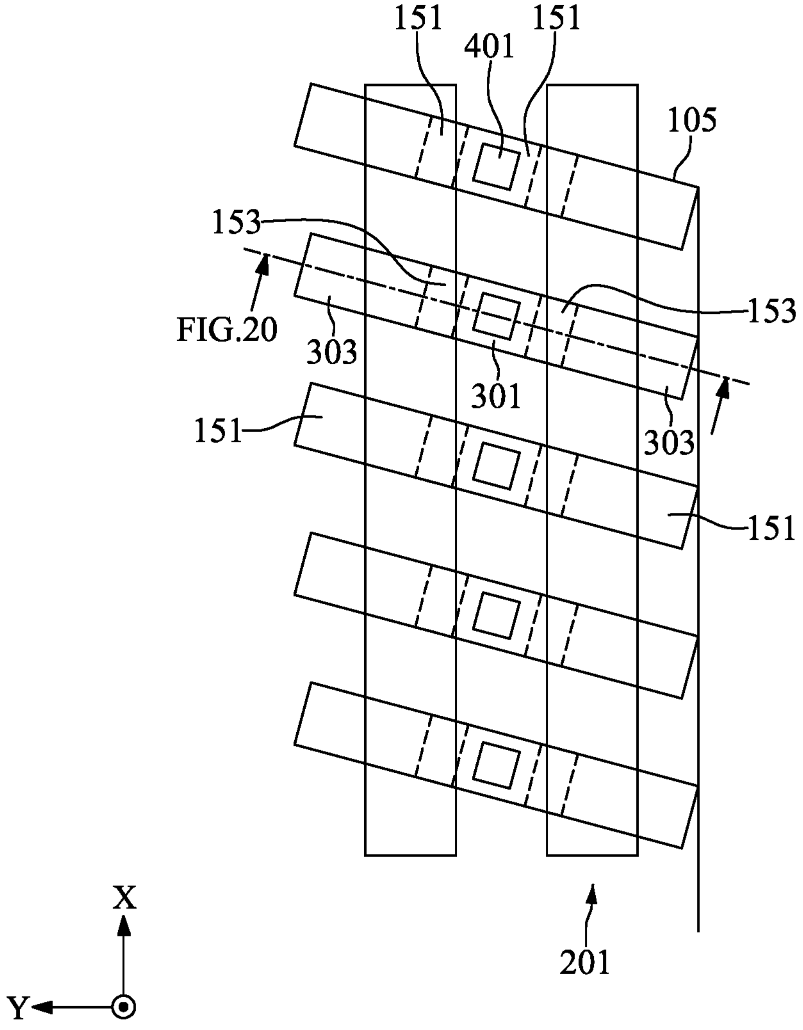
FIG. 21 is a top view of an intermediate stage in accordance with FIG. 20.

Referring to FIGS. 20 and 21, the first insulating layer 801 is formed on the substrate 101. The contact 401 and the air gap 153 are disposed in the first insulating layer 801. The first insulating layer 801 may be formed of, for example, silicon nitride, silicon oxide, silicon oxynitride, undoped silica glass, borosilicate glass, phospholipase glass, borophosphosilicate glass, or a combination thereof, but is not limited thereto. The first insulating layer 801 is formed by a depositing process, such as a chemical vapor deposition, a physical vapor deposition, a sputtering, or the like.

In some embodiments, the contact 401 is formed by processes comprising: performing a photolithography process to define a position of the contact 401; performing an etching process, such as an anisotropic dry etching process, to form an opening (not shown) in the first insulating layer 801; depositing a conductive material and performing a metallization process in the opening to form the contact 401; and performing a planarization process to remove excess deposited material and thus provide a substantially flat surface for subsequent processing steps. In some embodiments, the conductive material includes aluminum, copper, tungsten, cobalt, or other suitable metal or metal alloys. In some embodiments, the metallization process is a chemical vapor deposition, a physical vapor deposition, a sputtering, or the like.

In some embodiments, the contact 401 is disposed on the first doped region 301 and is electrically connected to the first doped region 301. In some embodiments, the contact 401 is made of tungsten.

In some embodiments, the air gaps 153 are disposed in the first insulating layer 801. In some embodiments, the air gaps 153 are disposed on opposite sides of the contact 401 and are spaced apart from the contact 401. A width W11 of each of the air gaps 153 is substantially less than, equal to, or greater than a width W12 of the word line 201. A centerline C of the air gap 153 is substantially aligned with a side surface S1 or a side surface S2 of the word line 201, wherein the side surface S1 and the side surface S2 face toward the contact 401. The air gaps 153 are formed by processes comprising: performing a photolithography process to define a position of each of the air gaps 153; performing an etching process, such as an anisotropic dry etching process, to form the air gaps 153 in the first insulating layer 801; and performing a planarization process, such as a chemical mechanical polishing, to provide a substantially flat surface for subsequent processing steps. After the forming of the contact 401 and the air gaps 153, each of remaining portions of the first insulating layer 801 is referred to as a supporting section 151.

Figure 22:
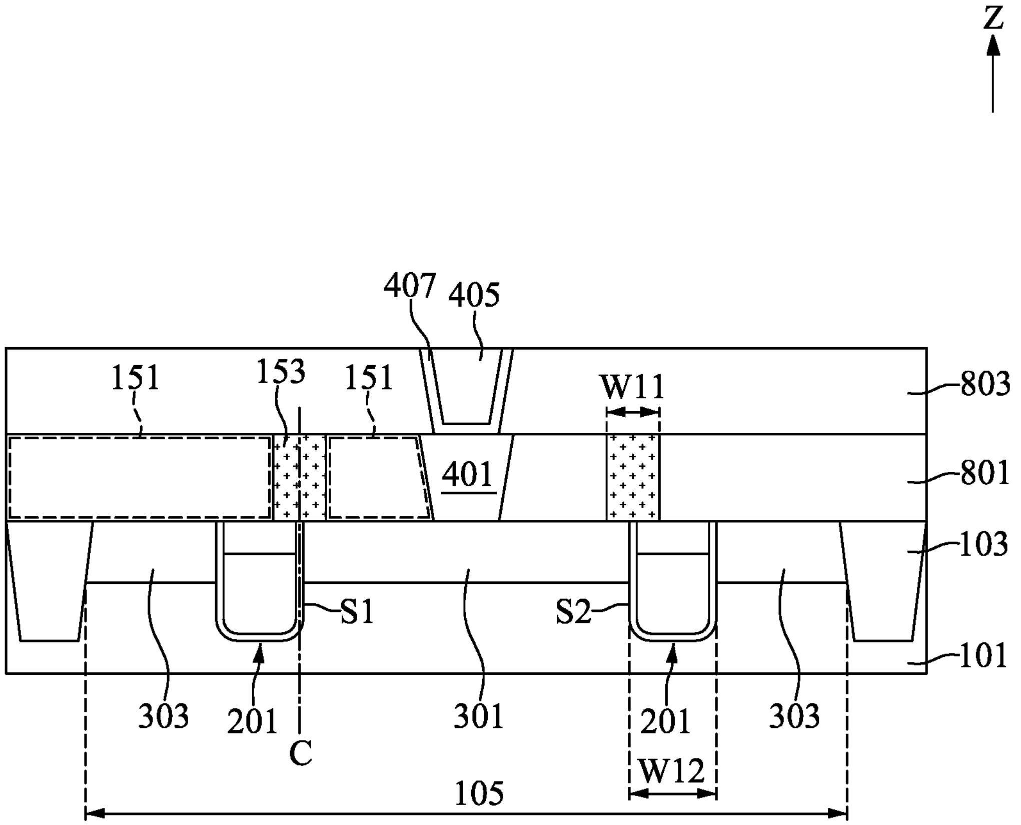
FIG. 22 is a sectional view of an intermediate stage in the formation of a semiconductor device in accordance with some embodiments of the present disclosure.
Figure 23:
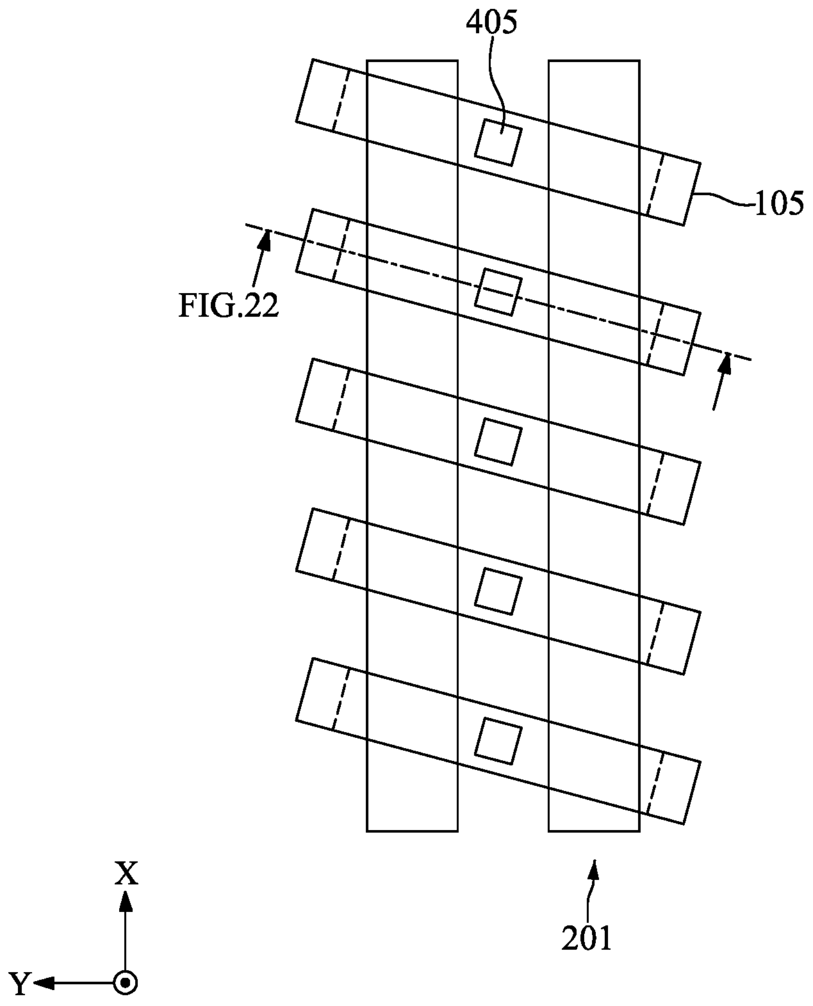
FIG. 23 is a top view of an intermediate stage in accordance with FIG. 22.

Referring to FIGS. 22 and 23, the second insulating layer 803 is formed on the first insulating layer 801. The bit line contact 405 is formed in the second insulating layer 803. The second insulating layer 803 may be made of a material same as that of the first insulating layer 801, but is not limited thereto. The second insulating layer 803 is formed by a process same as that of the first insulating layer 801.

In some embodiments, the bit line contact 405 is formed by processes comprising: performing a photolithography process to define a position of the bit line contact 405;

performing an etching process, such as an anisotropic dry etching process, to form a bit line contact opening (not shown) in the second insulating layer 803 and expose a top surface of the contact 401 through the bit line contact opening; performing a cleaning process optionally using a reducing agent to remove defects on the top surface of the contact 401, including tungsten; forming a first coverage layer 407 covering a bottom and sidewalls of the bit line contact opening; depositing a conductive material and performing a metallization process in the bit line contact opening to form the bit line contact 405; and performing a planarization process to remove excess deposited material and thus provide a substantially flat surface for subsequent processing steps. In some embodiments, the reducing agent is titanium tetrachloride, tantalum tetrachloride, or a combination thereof. In some embodiments, the first coverage layer 407 includes tungsten nitride. In some embodiments, the conductive material includes aluminum, copper, tungsten, cobalt, or other suitable metal or metal alloys. In some embodiments, the metallization process is a chemical vapor deposition, a physical vapor deposition, a sputtering, or the like. In some embodiments, the planarization process is a chemical mechanical polishing.

In some embodiments, the bit line contact 405 is electrically connected to the contact 401. Accordingly, the bit line contact 405 is electrically coupled to the first doped region 301.

Figure 24:
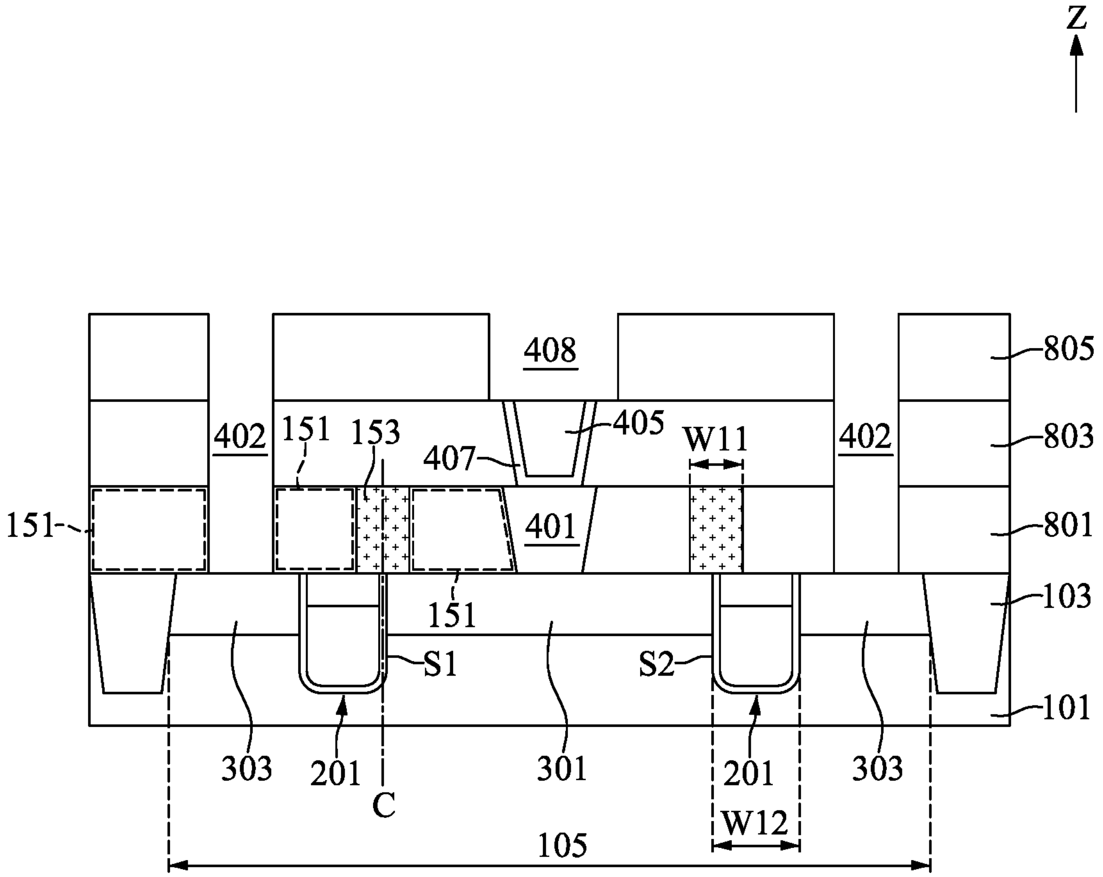
FIG. 24 is a sectional view of an intermediate stage in the formation of a semiconductor device in accordance with some embodiments of the present disclosure.
Figure 25:
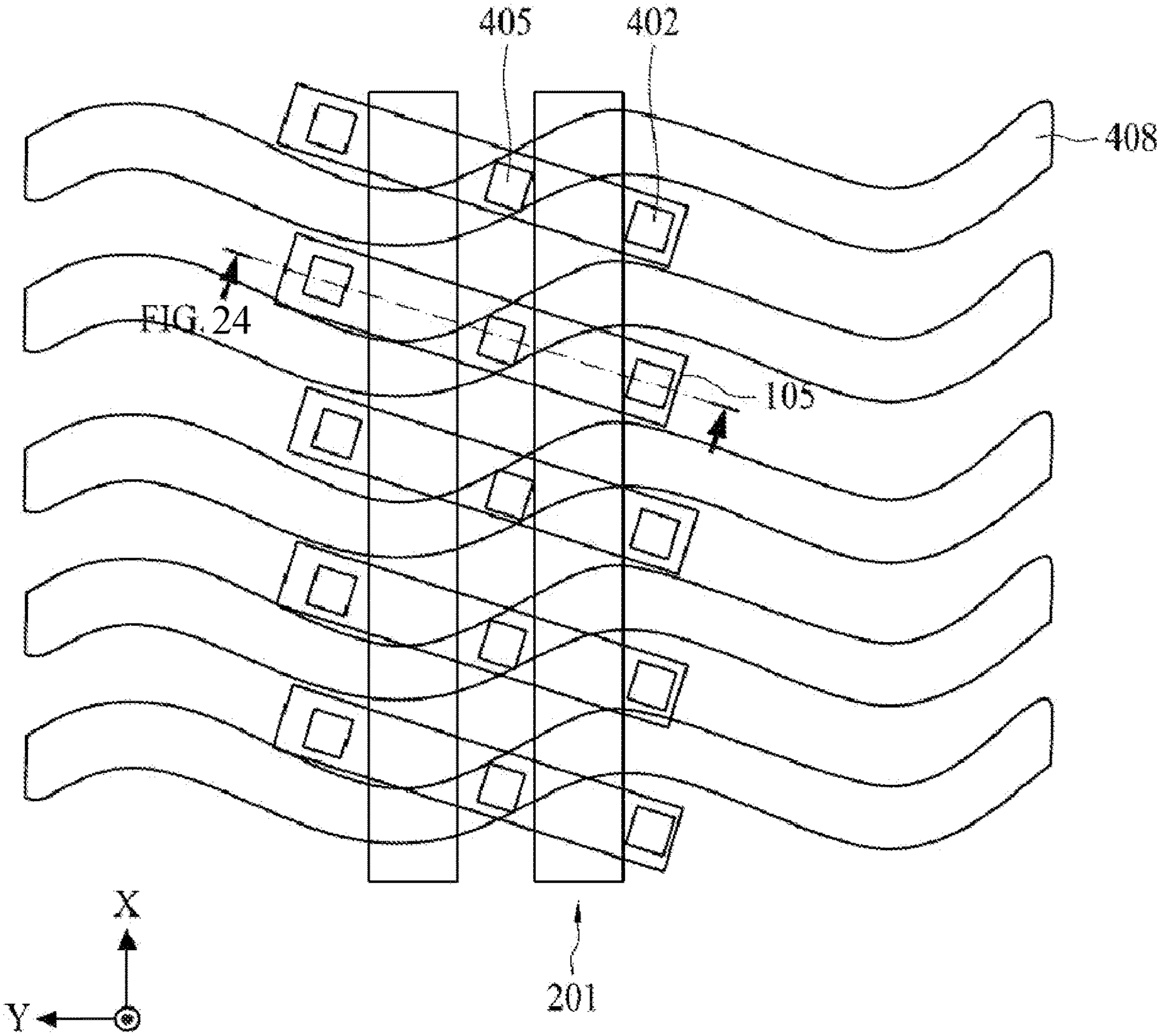
FIG. 25 is a top view of an intermediate stage in accordance with FIG. 24.

Referring to FIGS. 24 and 25, the third insulating layer 805 is formed over the second insulating layer 803, a contact hole 402 is formed over the substrate 101, and a bit line trench opening 408 is formed over the bit line contact 405. The third insulating layer 805 may be made of a material same as that of the first insulating layer 801, but is not limited thereto. The third insulating layer 805 is formed by a process same as that of the first insulating layer 801.

In some embodiments, the bit line trench opening 408 is formed by processes comprising: performing a photolithography process to define a position of the bit line trench opening 408 and performing an etching process, such as an anisotropic dry etching process, to form the bit line trench opening 408 in the third insulating layer 805. In some embodiments, the photolithography process may also define a position of the contact hole 402, and the etching process is performed to form the contact hole 402 penetrating through the third insulating layer 805, the second insulating layer 803, and the first insulating layer 801. The contact hole 402 may also be referred to as a deep hole, while the bit line trench opening 408 is relatively shallow.

Figure 26:
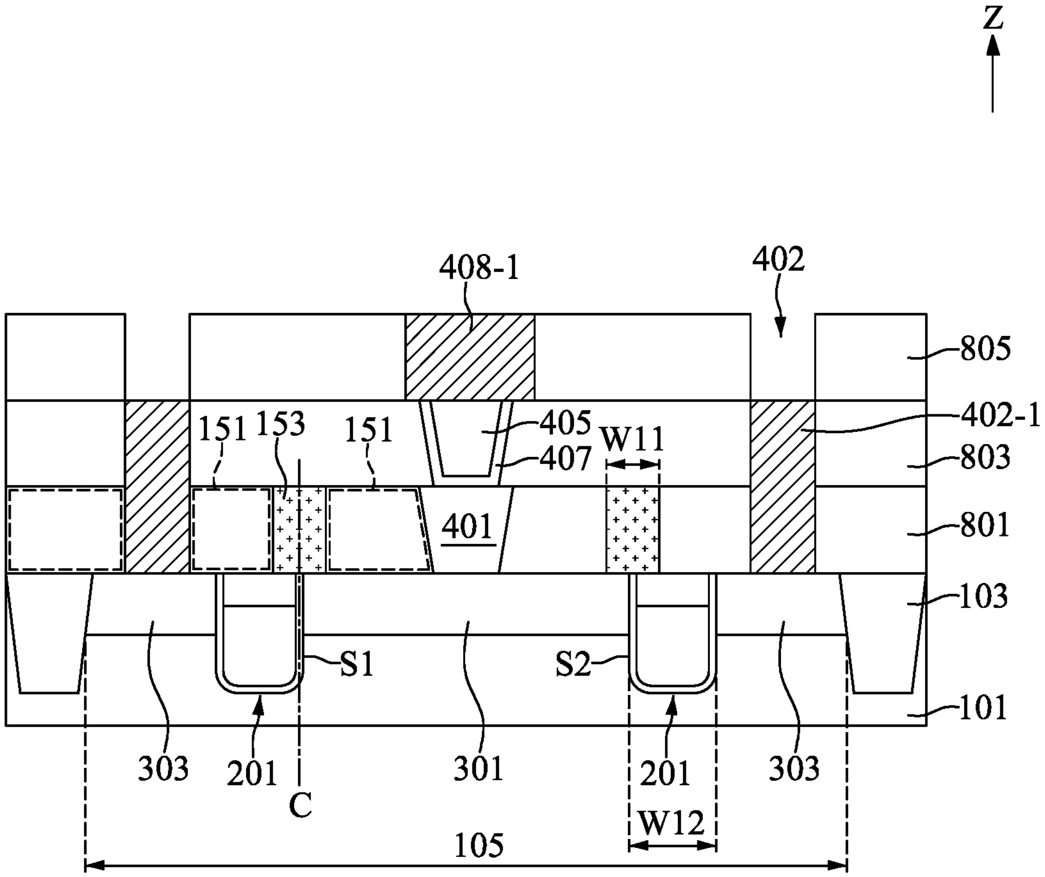
FIG. 26 is a sectional view of an intermediate stage in the formation of a semiconductor device in accordance with some embodiments of the present disclosure.
Figure 27:
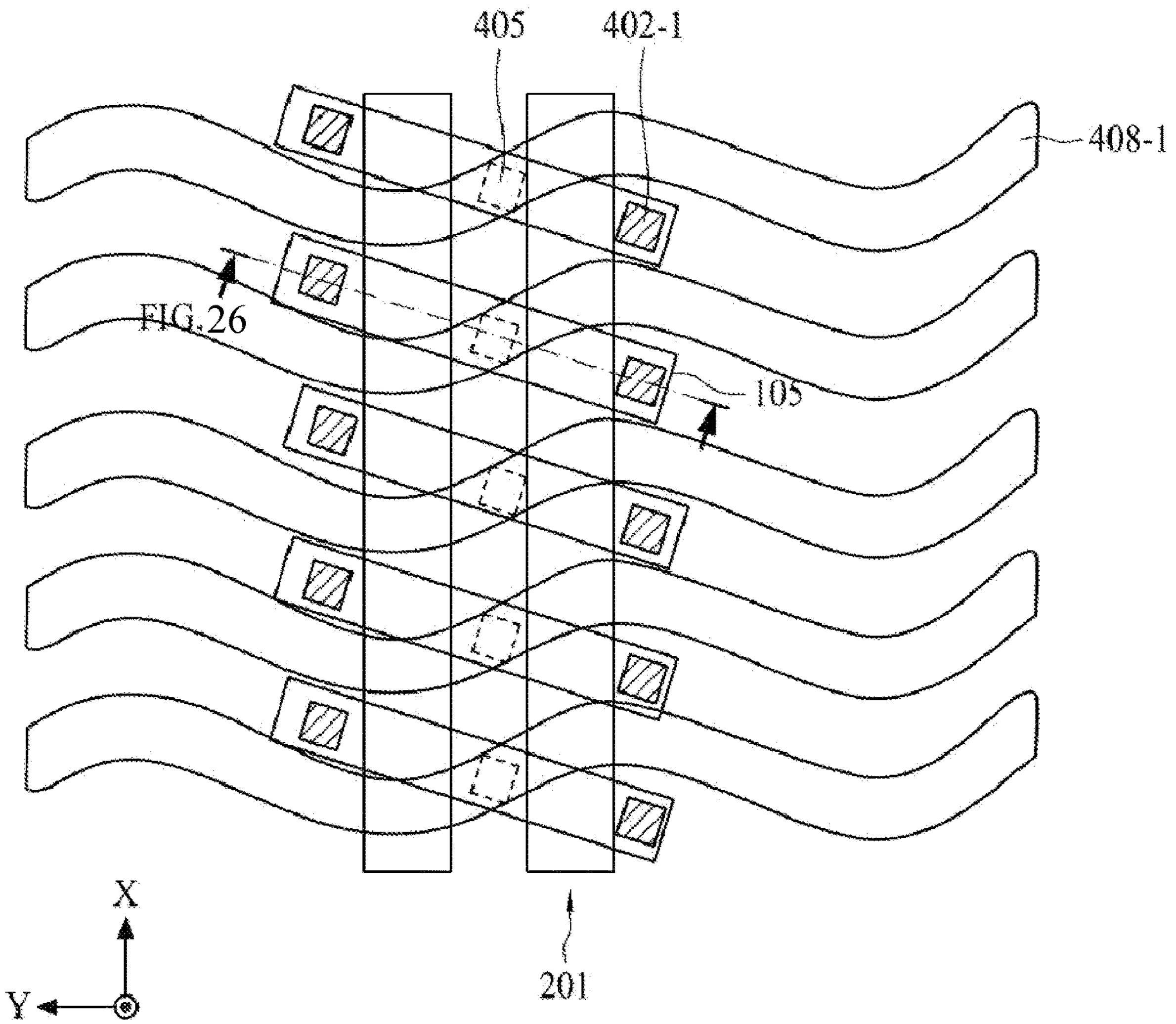
FIG. 27 is a top view of an intermediate stage in accordance with FIG. 26.

Referring to FIGS. 26 and 27, in some embodiments, the bit line trench opening 408 and the contact hole 402 are filled with material using processes such as chemical vapor deposition, physical vapor deposition, or sputtering. In some embodiments, a depth of the contact hole 402 is greater than a depth of the bit line trench opening 408. Consequently, the bit line trench opening 408 is filled with a filling material 408-1, while the contact hole 402 is partially filled with a filling material 402-1, which may be same as the filling material 408-1. Additionally, in some embodiments, the filling material 402-1 does not fill an upper portion of the contact hole 402 in the third insulating layer 805.

Figure 28:
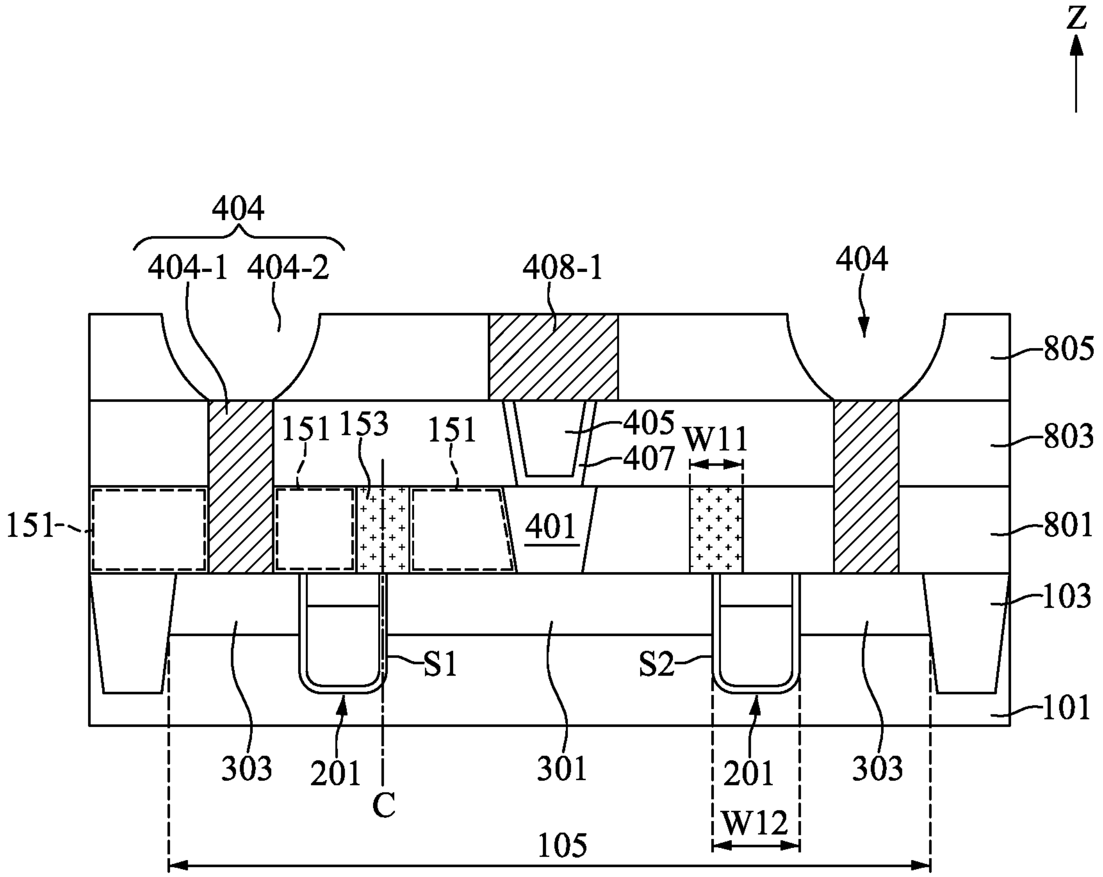
FIG. 28 is a sectional view of an intermediate stage in the formation of a semiconductor device in accordance with some embodiments of the present disclosure.
Figure 29:
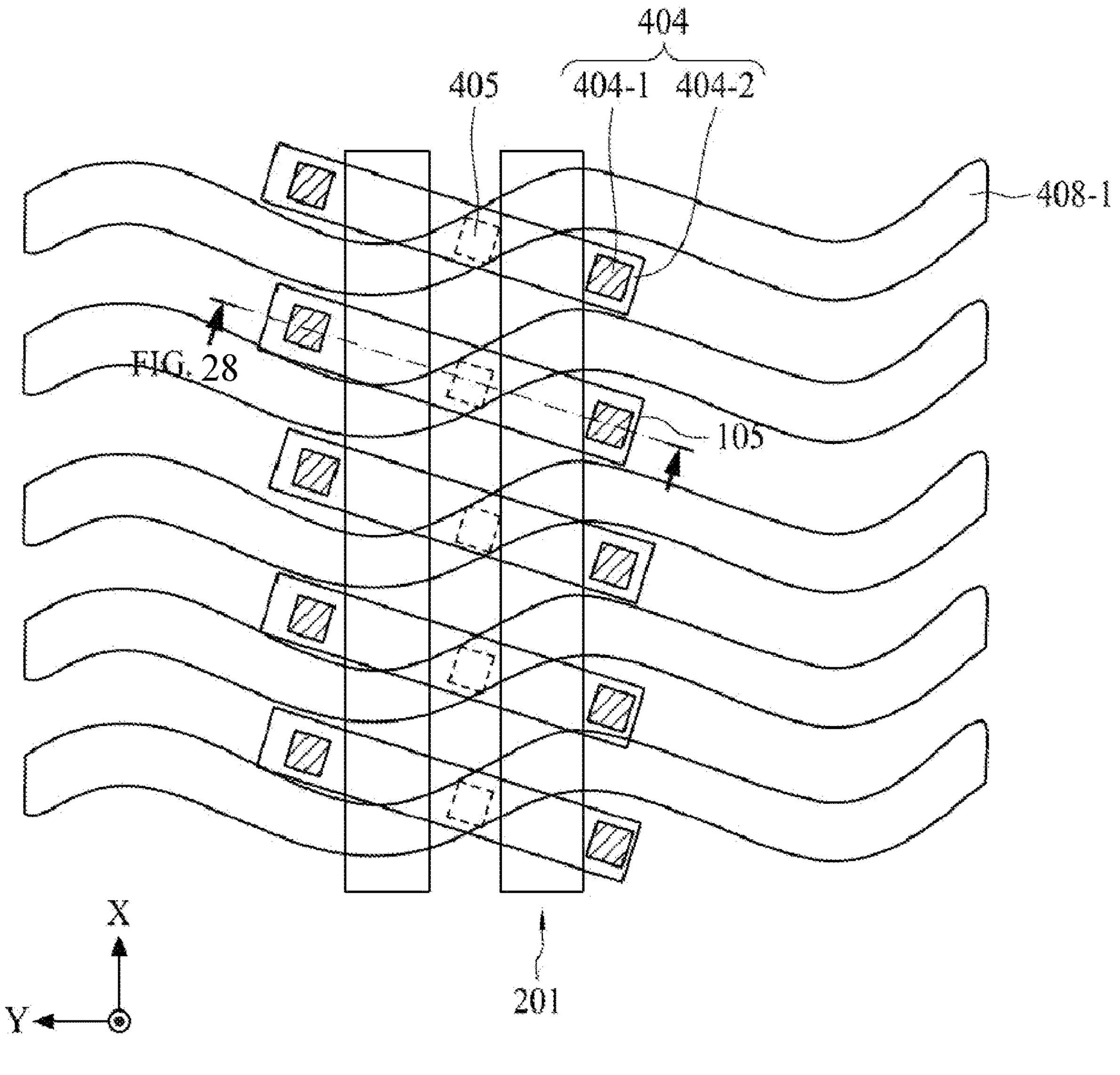
FIG. 29 is a top view of an intermediate stage in accordance with FIG. 28.

Referring to FIGS. 28 and 29, a transformed hole 404 is formed over the second doped region 303 of the substrate 101. In some embodiments, an etching process, such as an isotropic etching process, is performed to remove a portion of the third insulating layer 805 around the contact hole 402 to form the transformed holes 404, which have a narrow portion 404-1 occupied by the filling material 402-1 in the second insulating layer 803 and a wide portion 404-2 in the third insulating layer 805.

Figure 30:
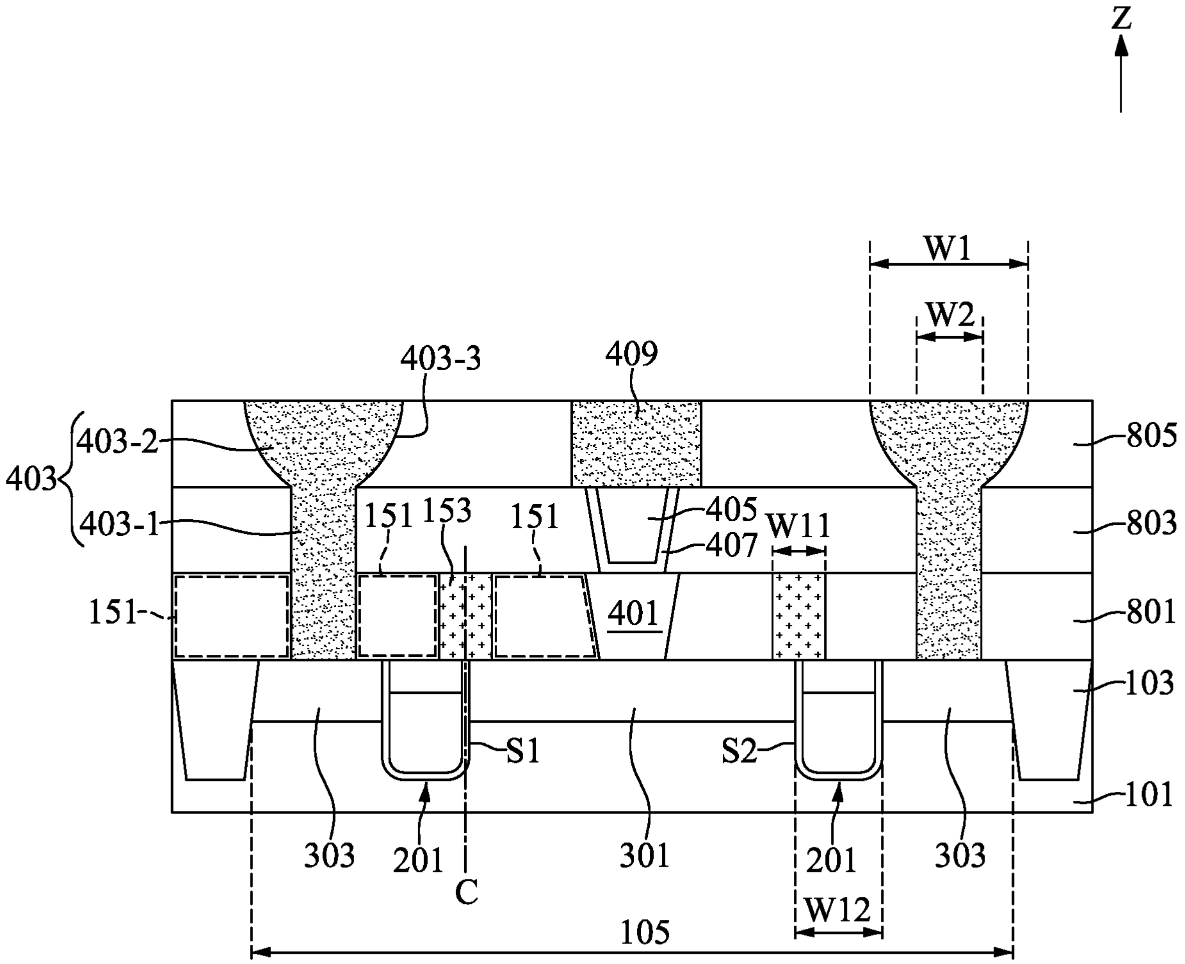
FIG. 30 is a sectional view of an intermediate stage in the formation of a semiconductor device in accordance with some embodiments of the present disclosure.
Figure 31:
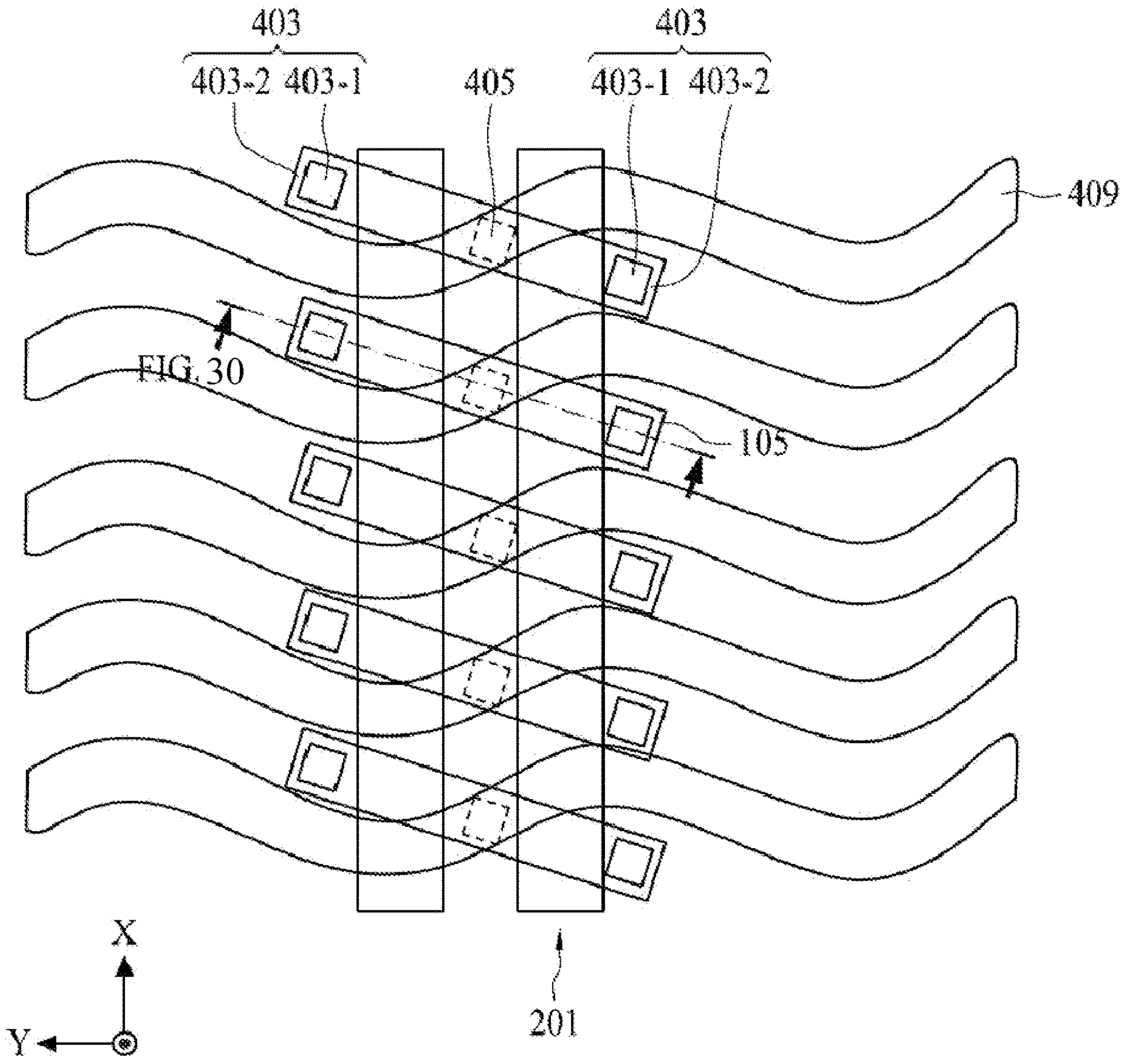
FIG. 31 is a top view of an intermediate stage in accordance with FIG. 30.

Referring to FIGS. 30 and 31, the bit line 409 is formed over the bit line contact 405, and the capacitor contact 403 is formed over the second doped region 303.

In some embodiments, the filling material 402-1 can be stripped from the transformed hole 404, and the filling material 408-1 can be stripped from the bit line trench opening 408. After the removal of the filling materials, a conductive material, such as aluminum, copper, tungsten, cobalt, or another suitable metal or metal alloy may be deposited. A metallization process is used to form the bit line 409 in the bit line trench opening 408 and the capacitor contact 403 in the transformed hole 404. In some embodiments, the metallization process is a chemical vapor deposition, a physical vapor deposition, or a sputtering. A planarization process, such as chemical mechanical polishing, is performed after the metallization process to remove excess deposited materials and thus provide a substantially flat surface for subsequent processing steps.

In some embodiments, the capacitor contact 403 includes a neck portion 403-1 and a head portion 403-2 over the neck portion 403-1. An upper width W1 of the head portion 403-2 is greater than an upper width W2 of the neck portion 403-1. In some embodiments, the upper width W2 of the neck portion 403-1 is substantially equal to a bottom width of the head portion 403-2. In some embodiments, the head portion 403-2 has a curved sidewall 403-3. In some embodiments, the head portion 403-2 has a tapered profile.

In some embodiments, the bit line 409 extends in the Y direction and appears as a wavy line in a top view. The bit line contact 405 is disposed at an intersection of the bit line 409 and the active region 105. The bit line 409, implemented as a wavy line, can increase a contact area between the bit line contact 405 and the active region 105. Thus, a contact resistance between the bit line contact 405 and the active region 105 is reduced.

Figure 32:
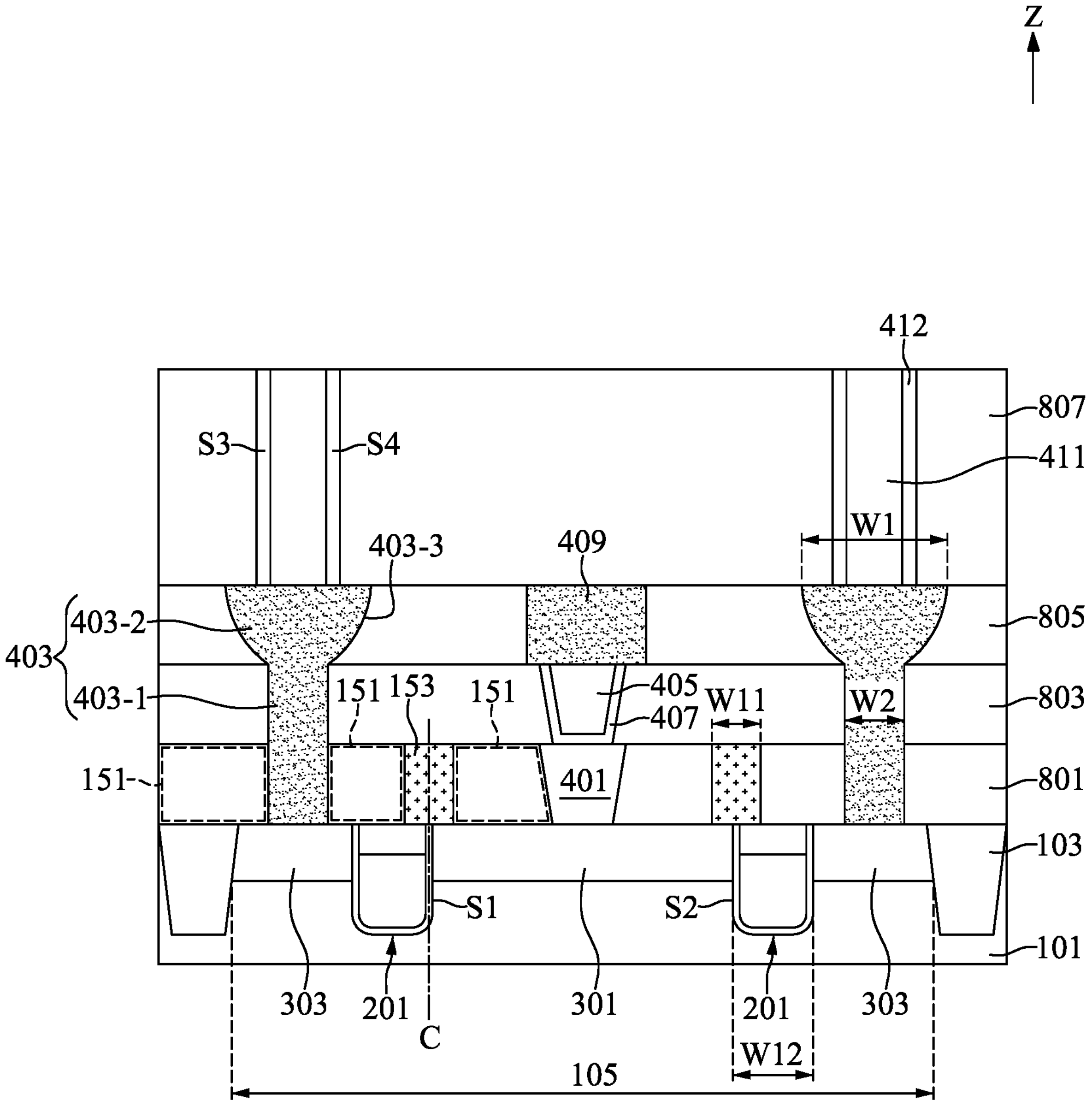
FIGS. 32 to 35 are sectional views of intermediate stages in the formation of a semiconductor device in accordance with some embodiments of the present disclosure.
Figure 33:
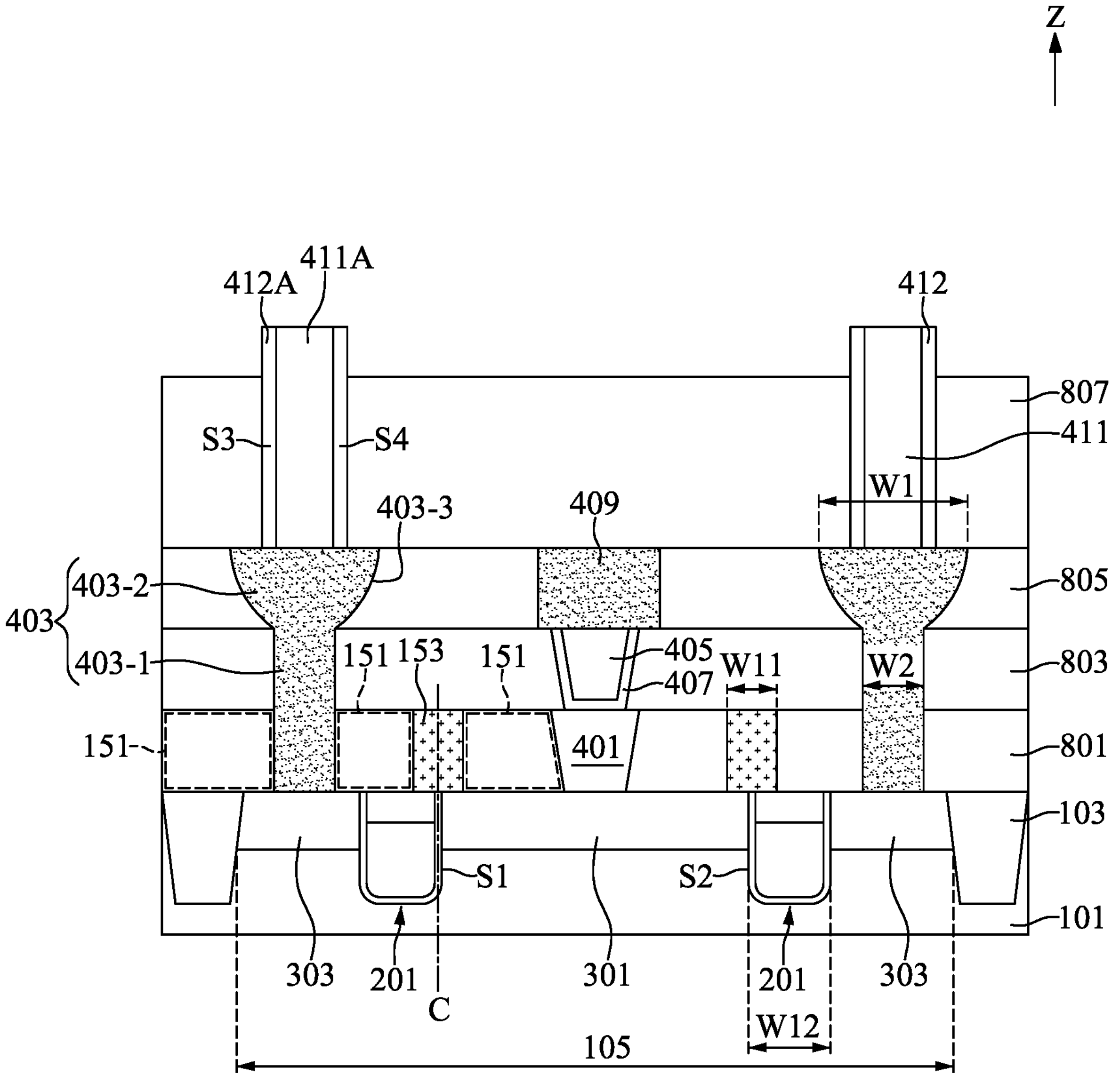

Referring to FIG. 11 and FIGS. 32 to 33, in step S15, a fourth insulating layer 807 is formed over the third insulating layer 805, and a capacitor plug 411 is formed in the fourth insulating layer 807. The fourth insulating layer 807 may be made of a material same as that of the first insulating layer 801, but is not limited thereto. The fourth insulating layer 807 is formed by a process same as that of the first insulating layer 801. The capacitor plug 411 is formed by processes comprising: performing a photolithography process to define a position of the capacitor plug 411; performing an etching process, such as an anisotropic dry etching process, to form a capacitor plug opening (not shown) extending through the fourth insulating layer 807; depositing a conductive material over the fourth insulating layer 807 and in the capacitor plug opening; performing a metallization process in the capacitor plug opening to form the capacitor plug 411 over the head portion 403-2 of the capacitor contact 403; and performing a planarization process, such as chemical mechanical polishing, to remove excess deposited material, thus providing a substantially flat surface for subsequent processing steps. In some embodiments, the conductive material comprises aluminum, copper, tungsten, cobalt, or another suitable metal or metal alloy. In some embodiments, the metallization process is a chemical vapor deposition, a physical vapor deposition, or a sputtering. In some embodiments, a barrier layer 412 is disposed between the capacitor plug 411 and the fourth insulating layer 807. The barrier layer 412 is disposed on and attached to sidewalls of the capacitor plug 411. The barrier layer 412 is made of titanium (Ti), titanium nitride (TiN), or a combination thereof.

Referring to FIG. 33, an etching process is performed to remove a portion of the fourth insulating layer 807 to expose a protruding portion 411A of the capacitor plug 411. In some embodiments, an etch-back process is performed to remove a top portion of the fourth insulating layer 807 to expose the protruding portion 411A of the capacitor plug 411 and a top portion 412A of the barrier layer 412. In some embodiments, after the etch-back process, a top surface of capacitor plug 411 is higher than a top surface of the fourth insulating layer 807, and a sidewall of the top portion 412A is exposed.

Figure 34:
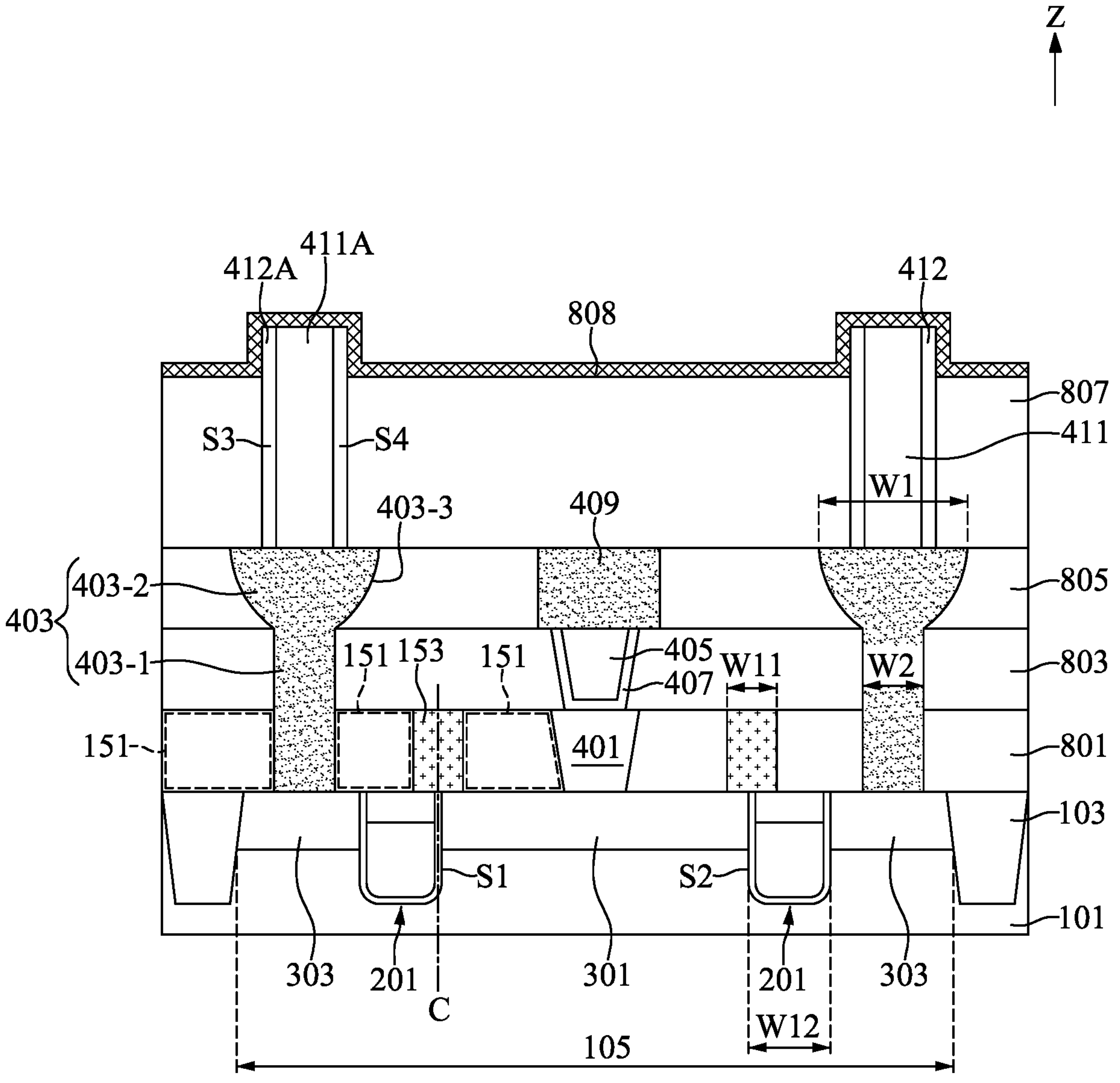
Figure 35:
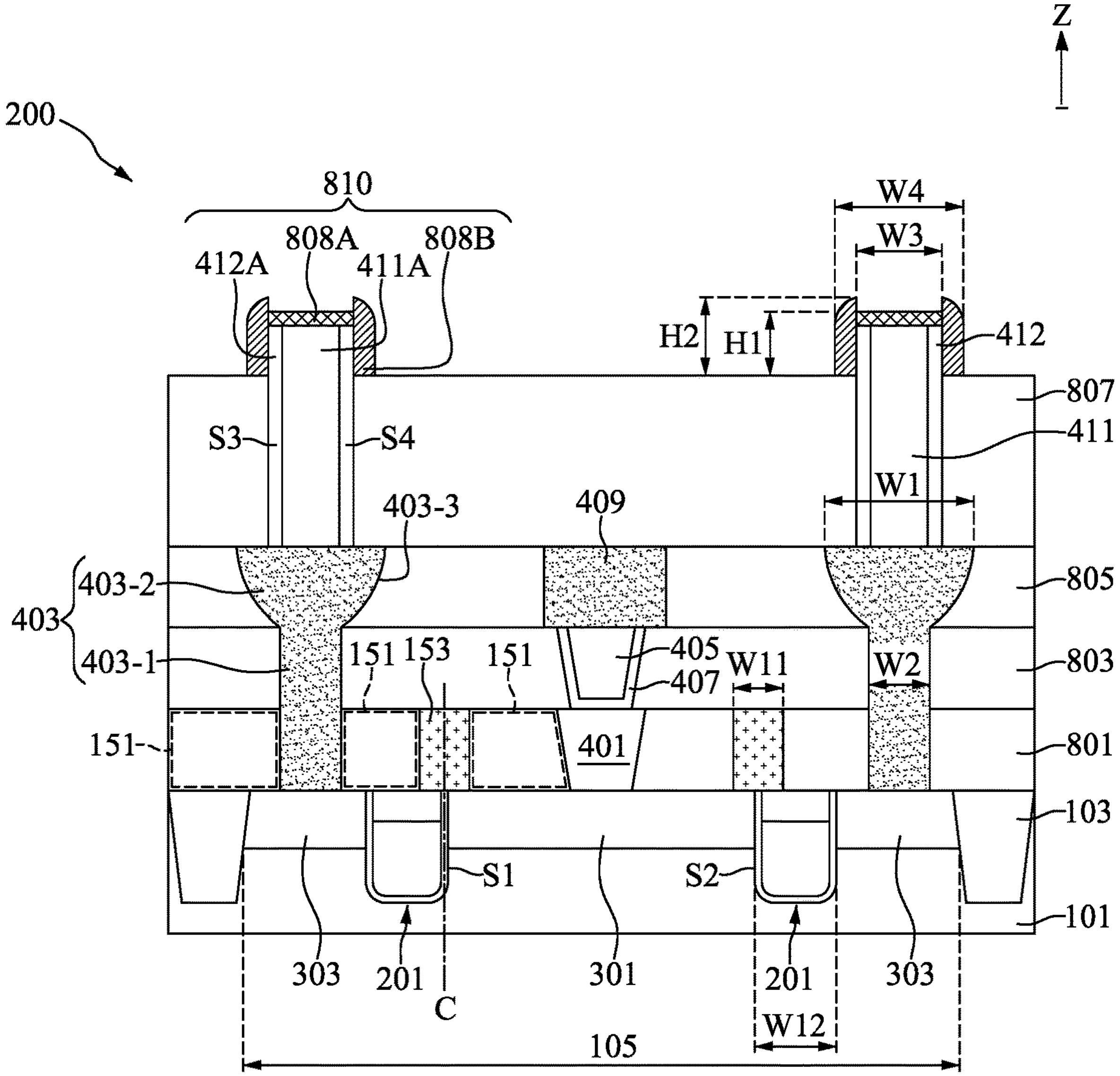

Referring to FIG. 11 and FIGS. 34 to 35, in step S17, a landing pad 810 is formed over the fourth insulating layer 807.

Referring to FIG. 34, a deposition process is performed to form a liner layer 808 covering the top surface of the fourth insulating layer 807, a top surface of the protruding portion 411A, and the sidewalls of the top portion 412A. In some embodiments, the liner layer 808 is a silicon-containing layer, such as a polysilicon layer.

Referring to FIG. 35, a thermal process is performed to form the landing pad 810 over the fourth insulating layer 807. In some embodiments, a silicide process (thermal process) is performed to form the landing pad 810 over the fourth insulating layer 807, wherein the landing pad 810 comprises the protruding portion 411A of the capacitor plug 411, the top portion 412A of the barrier layer 412, a first silicide layer (metal silicide) 808A over the protruding portion 411A, and a second silicide layer (metal silicide) 808B on a sidewall of the protruding portion 411A. In some embodiments, the thermal process transforms a portion of the protruding portion 411A and the liner layer 808 into the first silicide layer 808A. In some embodiments, the thermal process transforms the top portion 412A of the barrier layer 412 and the liner layer 808 into the second silicide layer 808B. In other words, the landing pad 810 is formed without using the lithographic technique, i.e., the landing pad 810 is self-aligned to the capacitor plug 411. In some embodiments, a thickness and a shape of the protruding portion 411A and the top portion 412A may be changed (not shown in the drawings).

In some embodiments, an etching process, such as an anisotropic dry etching process, is performed to remove a portion of the liner layer 808 not transformed into the metal silicide by the thermal process. In some embodiments, the silicide process between the top portion 412A and the liner layer 808 proceeds more quickly than the silicide process between the protruding portion 411A and the liner layer 808, and the top end of the second silicide layer 808B is higher than the top end of the first silicide layer 808A. In other words, since a height H2 of the second silicide layer 808B is greater than a height H1 of the first silicide layer 808A, a step structure is formed between the first silicide layer 808A and the second silicide layer 808B. In some embodiments, the second silicide layer 808B surrounds the first silicide layer 808A, and a width W4 of the second silicide layer 808B is greater than a width W3 of the first silicide layer 808A.

FIGS. 36 to 39 are semiconductor devices in accordance with various embodiments of the present disclosure. Such semiconductor devices are similar to the semiconductor device 200 in many aspects, and description of similar features will not be repeated herein.

Figure 36:
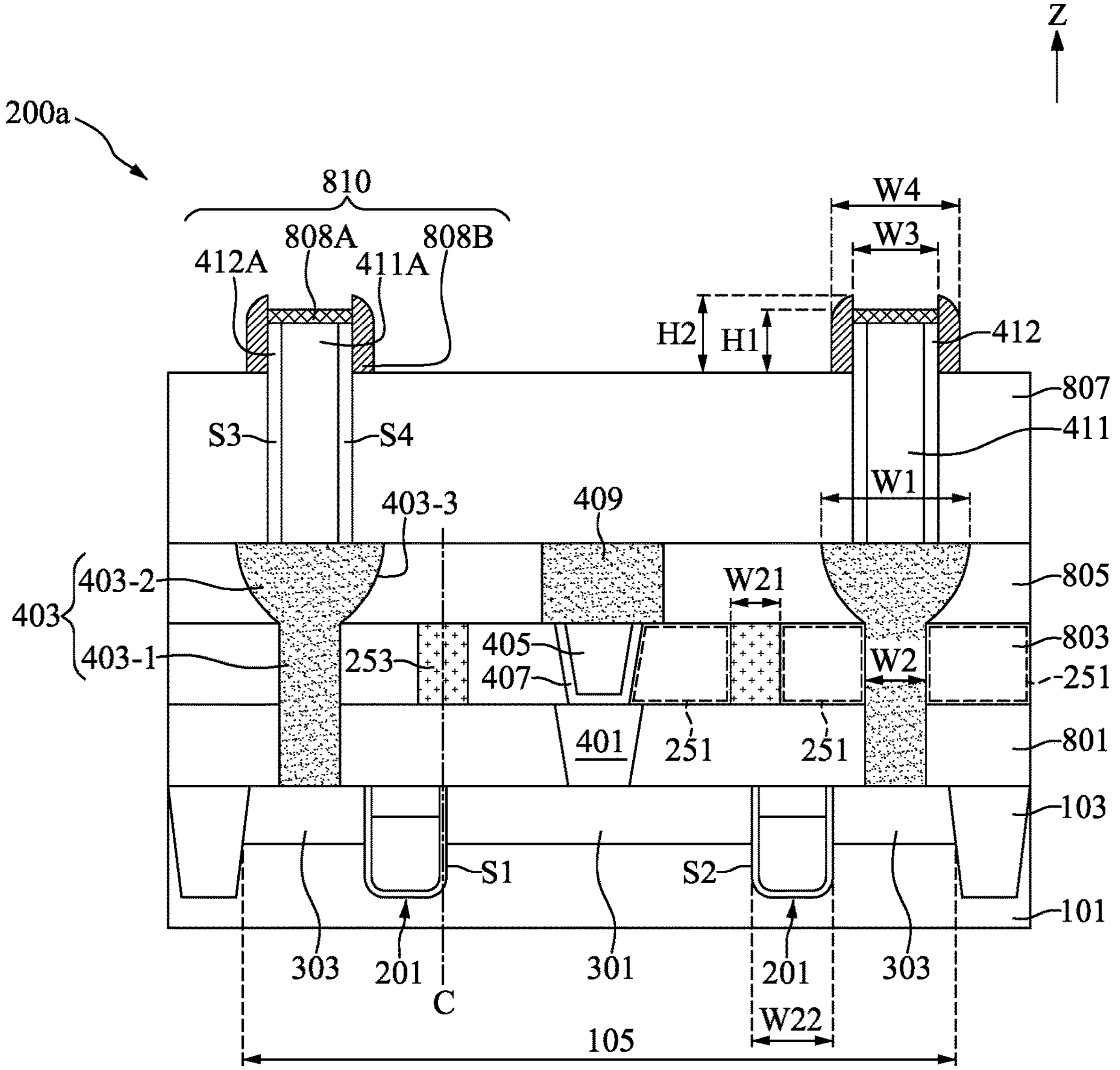
FIGS. 36 to 39 are sectional views of a semiconductor device in accordance with various embodiments of the present disclosure.

Referring to FIG. 36, at least one air gap 253 is disposed in the second insulating layer 803 and is disposed on opposite sides of the bit line contact 405. A width W21 of each of the air gaps 253 is substantially less than, equal to, or greater than a width W22 of the word line 201. A centerline C of each of the air gaps 253 is aligned with the side surface S1 or the side surface S2 of the word line 201, wherein the side surface S1 and the side surface S2 face toward the bit line contact 405. After the forming of the air gap 253, each of remaining portions of the second insulating layer 803 is referred to as a supporting section 251.

Figure 37:
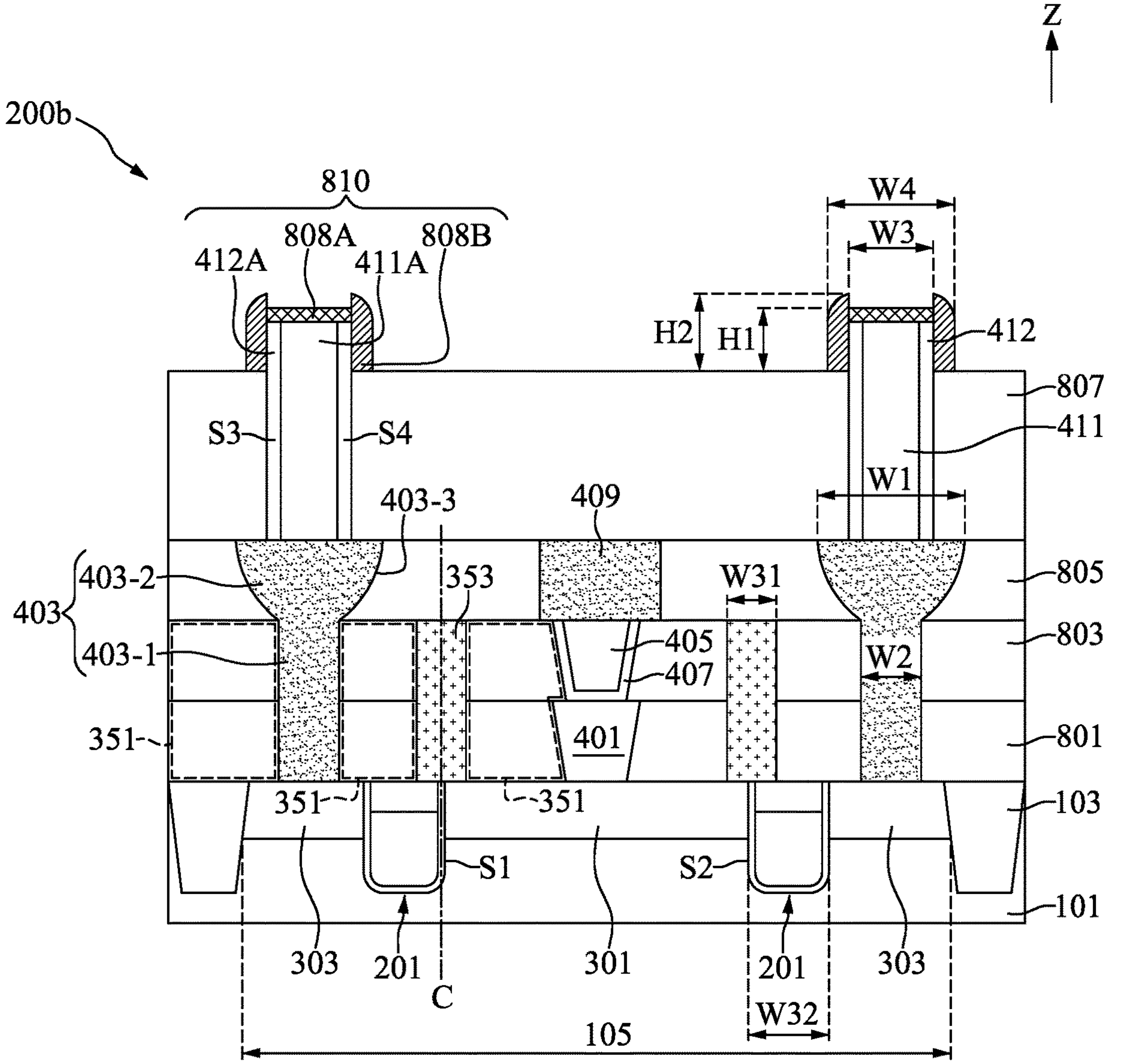

Referring to FIG. 37, at least one air gap 353 is disposed in and passes through the first insulating layer 801 and the second insulating layer 803. The air gaps 353 are disposed on opposite sides of the bit line contact 405. A width W31 of each of the air gaps 353 is substantially less than, equal to, or greater than a width W32 of the word line 201. A centerline C of each of the air gaps 353 is aligned with the side surface S1 or the side surface S2 of the word line 201, wherein the side surface S1 and the side surface S2 face toward the bit line contact 405. After the forming of the air gaps 353, remaining portions of the first insulating layer 801 and the second insulating layer 803 are referred to as supporting sections 351.

Figure 38:
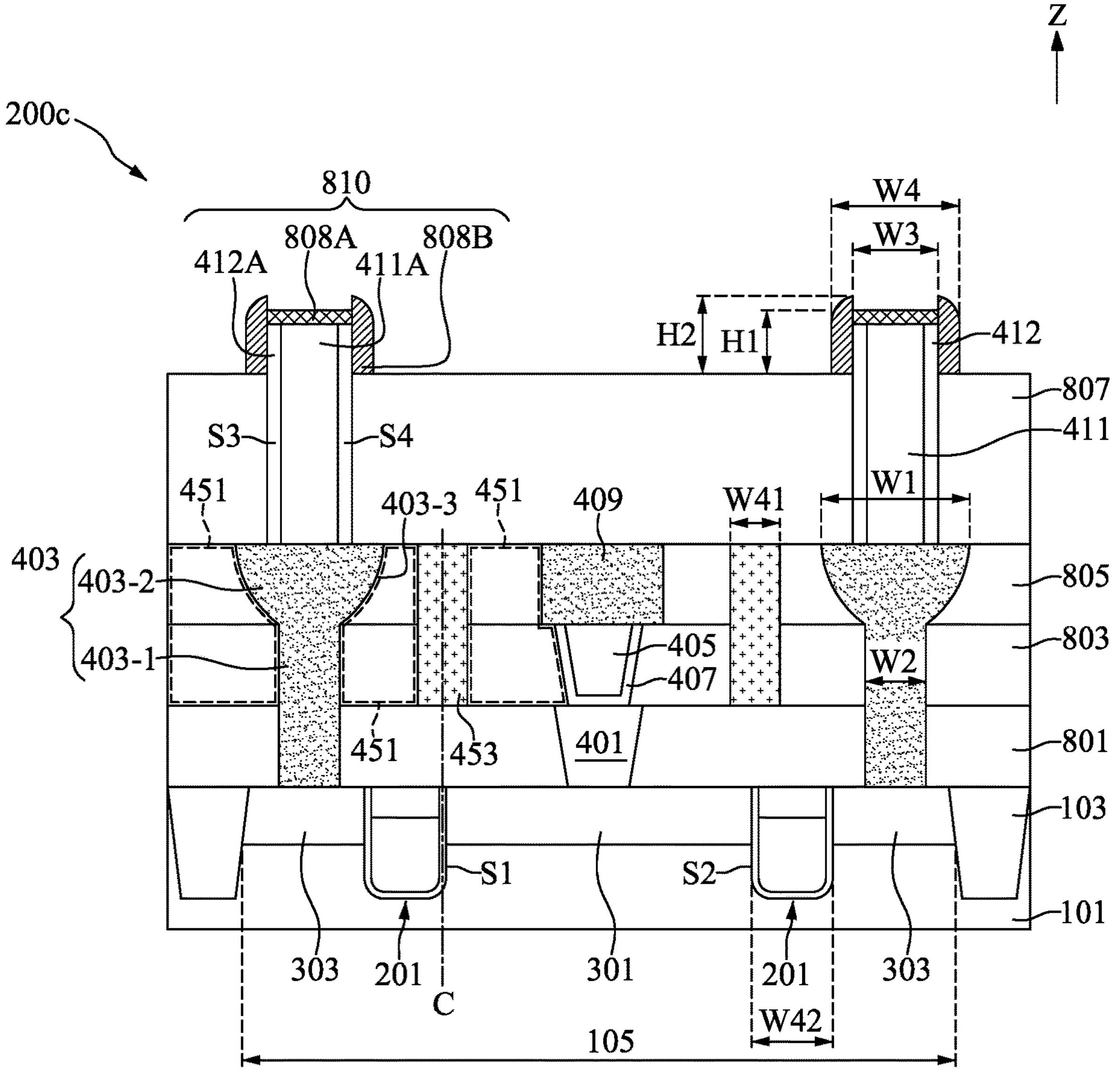

Referring to FIG. 38, at least one air gap 453 is disposed in and passes through the second insulating layer 803 and the third insulating layer 805. The air gaps 453 are disposed on opposite sides of the bit line 409. A width W41 of each of the air gaps 453 is substantially less than, equal to, or greater than a width W42 of the word line 201. A centerline C of each of the air gaps 453 is aligned with the side surface S1 or the side surface S2 of the word line 201, wherein the side surface S1 and the side surface S2 face toward the bit line 409. After the forming of the air gaps 453, remaining portions of the second insulating layer 803 and the third insulating layer 805 are referred to as supporting sections 451.

Figure 39:
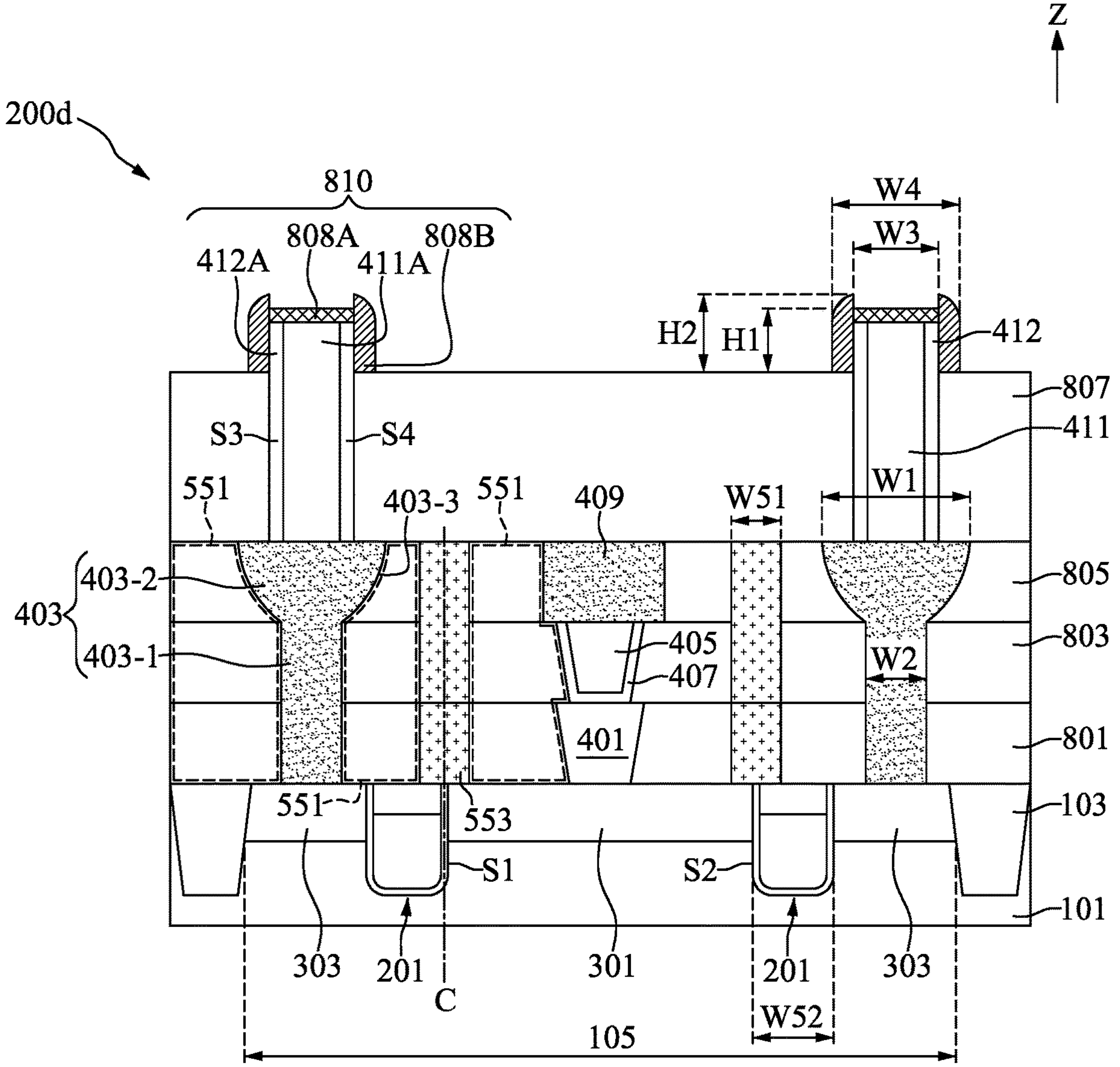

Referring to FIG. 39, at least one air gap 553 is disposed in and passes through the first insulating layer 801, the second insulating layer 803, and the third insulating layer 805. The air gaps 553 are disposed on opposite sides of the contact 401. A width W51 of each of the air gaps 553 is substantially less than, equal to, or greater than a width W52 of the word line 201. A centerline C of each of the air gaps 553 is aligned with the side surface S1 or the side surface S2 of the word line 201, wherein the side surface S1 and the side surface S2 face toward the contact 401. After the forming of the air gaps 553, remaining portions of the first insulating layer 801, the second insulating layer 803, and the third insulating layer 806 are referred to as supporting sections 551.

One aspect of the present disclosure provides a semiconductor device. The semiconductor device includes a substrate with a drain region and a source region disposed in the substrate; a gate structure disposed over the substrate and disposed between the drain region and the source region; a first dielectric disposed over the substrate and covering the substrate and the gate structure; a plug disposed in the first dielectric, wherein the plug includes a first portion extending through the first dielectric and contacting the source region of the substrate, and a second portion protruding from the first dielectric; a storage node landing pad disposed on an exposed part of the second portion of the plug; a second dielectric disposed over the first dielectric and covering the storage node landing pad; at least one air gap disposed in the second dielectric; a bit line extending through the second dielectric and the first dielectric and connected to the substrate; a third dielectric disposed over the bit line; and a storage node disposed over the third dielectric, wherein the storage node extends through the third dielectric and the second dielectric and contacts the storage node landing pad.

Another aspect of the present disclosure provides a semiconductor device. The semiconductor device includes a substrate with a source region, a drain region, and a word line disposed in the substrate; a dielectric layer disposed over the substrate; at least one air gap disposed in the dielectric layer; a plug disposed in the dielectric layer; a barrier layer disposed on sidewalls of the plug; and a landing pad disposed over the dielectric layer. The barrier layer comprises a top portion over the dielectric layer.

Another aspect of the present disclosure provides a method for fabricating a semiconductor device. The method includes providing a substrate with a gate structure disposed thereon; forming a first interlayer dielectric covering the substrate and the gate structure; forming a plug in the first interlayer dielectric; exposing a portion of the plug; forming a storage node landing pad on the exposed portion of the plug; forming a second interlayer dielectric on the first interlayer dielectric, wherein the second interlayer dielectric comprises at least one air gap; forming a bit line extending through the second interlayer dielectric and the first interlayer dielectric and connecting to the substrate; forming a third interlayer dielectric on the bit line; and forming a storage node on the third interlayer dielectric.

Although the present disclosure and its advantages have been described in detail, it should be understood that various changes, substitutions, and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods, and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A semiconductor device, comprising:

a substrate with a drain region and a source region disposed in the substrate;

a gate structure disposed over the substrate and between the drain region and the source region;

a first dielectric disposed over the substrate and covering the substrate and the gate structure;

a plug disposed in the first dielectric, wherein the plug includes a first portion extending through the first dielectric and contacting the source region of the substrate, and a second portion protruding from the first dielectric;

a storage node landing pad disposed on an exposed part of the second portion of the plug;

a second dielectric disposed over the first dielectric and covering the storage node landing pad;

at least one air gap disposed in the second dielectric;

a bit line extending through the second dielectric and the first dielectric and connected to the substrate;

a third dielectric disposed over the bit line; and a storage node disposed over the third dielectric, wherein the storage node extends through the third dielectric and the second dielectric and contacts the storage node landing pad;

wherein a length of the air gap is equal to a thickness of the second dielectric;

wherein a width of the air gap is uniform.

2. The semiconductor device of claim 1, further comprising a plurality of supporting sections disposed in the second dielectric, wherein the supporting sections are spaced apart from each other to define the air gaps, wherein the storage node landing pad is enclosed within at least one of the supporting sections adjacent to the air gap.

3. The semiconductor device of claim 2, wherein the supporting sections are separated by the air gaps.

4. The semiconductor device of claim 2, wherein the bit line comprises:

a first portion formed over the second dielectric; and a second portion extending through the second dielectric and the first dielectric to connect to the drain region of the substrate;

wherein at least one of the air gaps is located between the storage node landing pad and the second portion of the bit line.

5. The semiconductor device of claim 4, wherein the plurality of supporting sections are disposed between the first portion of the bit line and the gate structure.

6. The semiconductor device of claim 5, wherein the second portion of the bit line extends through one of the supporting sections adjacent to the air gap.

7. The semiconductor device of claim 1, wherein the air gaps extend through the second dielectric.

8. The semiconductor device of claim 1, wherein the width of the air gap is less than a width of the gate structure in a sectional view.

9. The semiconductor device of claim 1, wherein a centerline of the air gap is aligned with a centerline of the gate structure.

10. The semiconductor device of claim 1, further comprising a bit line landing pad on the drain region of the substrate, wherein the bit line connects to the drain region of the substrate by contacting the bit line landing pad.

11. The semiconductor device of claim 1, wherein the plug comprises copper and the storage node landing pad comprises $Cu_3Ge$.

12. The semiconductor device of claim 1, wherein the gate structure further comprises a silicide, a polycrystalline silicon, a gate oxide, and a spacer.

* * * * *